US007061825B2

(12) United States Patent
Yada et al.

(10) Patent No.: US 7,061,825 B2
(45) Date of Patent: Jun. 13, 2006

(54) SEMICONDUCTOR INTEGRATED CIRCUIT

(75) Inventors: Naoki Yada, Tokorozawa (JP);
Yasuyuki Saito, Higashiyamato (JP);
Yasushi Shibatsuka, Takasaki (JP);
Katsunori Koike, Hitachiota (JP);
Mitsuhiko Okutsu, Mito (JP)

(73) Assignees: Renesas Technology Corp., Tokyo (JP); Hitachi Engineering Co., Ltd., Ibaraki (JP)

( * ) Notice: Subject to any disclaimer, the term of this patent is extended or adjusted under 35 U.S.C. 154(b) by 164 days.

(21) Appl. No.: 10/867,013

(22) Filed: Jun. 15, 2004

(65) Prior Publication Data
US 2005/0047265 A1    Mar. 3, 2005

(30) Foreign Application Priority Data
Jul. 30, 2003  (JP)  ............................. 2003-203574

(51) Int. Cl.
*G11C 8/00* (2006.01)
(52) U.S. Cl. ..................... 365/233; 365/189.07; 331/34
(58) Field of Classification Search ..................... None
See application file for complete search history.

(56) References Cited
U.S. PATENT DOCUMENTS 5,070,311 A    12/1991 Nicolai ........................ 331/111
5,867,432 A *   2/1999 Toda ........................... 365/194
5,926,641 A *   7/1999 Shay ........................... 713/320
5,963,502 A *  10/1999 Watanabe et al. ........... 365/233
6,255,882 B1*   7/2001 Hirai ........................... 327/291
6,498,522 B1*  12/2002 Ikeda et al. .................. 327/141
6,686,803 B1*   2/2004 Perrott et al. .................. 331/10

FOREIGN PATENT DOCUMENTS

JP    10-187273    7/1998
JP    11-510938    9/1999
WO    97/44905    11/1997

* cited by examiner

Primary Examiner—Tan T. Nguyen
(74) Attorney, Agent, or Firm—Miles & Stockbridge P.C.

(57) ABSTRACT

A semiconductor integrated circuit includes a memory circuit, an oscillator circuit which generates an internal clock signal, based on control information held in the memory circuit, and a logic circuit which generates control information that causes the frequency of the internal clock signal to coincide with the frequency of an external clock signal. The internal clock signal is used for a synchronous operation of an internal circuit. Even if an error (undesired variation) occurs in the oscillation characteristic of the oscillator circuit due to process variations, it is possible to cause an internal clock signal frequency to coincide with an external clock signal frequency corresponding to a target frequency without the need for external attachment of a crystal oscillator and the input of an external clock signal.

29 Claims, 29 Drawing Sheets

SEMICONDUCTOR INTEGRATED CIRCUIT

CROSS-REFERENCE TO RELATED APPLICATION

The present application claims priority from Japanese patent application JP 2003-203574 filed on Jul. 30, 2003, the content of which is hereby incorporated by reference into this application.

BACKGROUND OF THE INVENTION

The present invention relates to a clock-synchronously operated electronic circuit, and particularly to a clock-synchronously operated semiconductor integrated circuit, and relates to a technique effective when applied to an information processing apparatus typified by a microcomputer, for example.

As a semiconductor integrated circuit such as a clock-synchronously operated microcomputer, there is known one wherein a synchronous clock signal is generated by internal oscillations alone without external attachment of a crystal oscillator (crystal unit, crystal oscillation). A microcomputer, which generates a synchronous clock signal by only internal oscillations without externally providing a crystal oscillator, has been described in the following patent document 1. A circuit, which trims the oscillation frequency of a built-in oscillator that internally oscillates, without external attachment of a crystal oscillator, has been described in the following patent document 2.

Patent document 1

Japanese Unexamined Patent Publication No. Hei 11(1999)-510938

Patent document 2

Japanese Unexamined Patent Publication No. Hei 10(1998)-187273

SUMMARY OF THE INVENTION

The present inventors firstly have discussed problems that arise where an oscillator is used for generation of a synchronous clock. There is a need to provide a capacitive element and a crystal oscillator where a semiconductor integrated circuit is activated using crystal oscillations. Areas for packaging them and their parts are required. Further, there may be cases where a terminal for the crystal oscillator is susceptible to external noise (EMS: Electro Magnetic Susceptibility) and a problem arises in customer's reliability at the configuration of a system. Further, since charge/discharge occurs in the terminal of the semiconductor integrated circuit to which the crystal oscillator is attached, a problem about radiant noise (EMI: Electro Magnetic Interface) arises. Since a waveform-shaping capacitor is connected to the terminal of the crystal oscillator, current consumption also increases. Further, a microcomputer called "less-pin micon" in which the number of external terminals is extremely reduced, is used in a sensor, network home appliances. In the case of the less-pin micon, a reduction in the number of terminals for a crystal oscillator can greatly contribute to a reduction in the number of external terminals.

Further, the present inventors have discussed where no oscillator is used for generation of a synchronous clock. When no oscillator is used for the generation of the synchronous clock, the oscillation frequency is greatly affected by process variations and thereby brought to a variation of a few tens of percents. Further, the oscillation frequency is also under the influence due to a variation in power supply voltage and a change in temperature although less than affected by the process variations, so that a variation of a few tens of percents occurs in the oscillation frequency. A clock precision of a few percents is required to establish communications in particular. Further, there is a need to make a configuration resistant to process variations, a variation in external voltage of a semiconductor integrated circuit and a change in temperature. Since it is necessary to carry out a test on a system equipped with a microcomputer at a high frequency and a low frequency upon internal oscillations at a fixed frequency, there has been a demand for such a configuration that the frequency can flexibly be changed even after its shipment.

An object of the present invention is to provide a semiconductor integrated circuit capable of performing built-in oscillations with high accuracy.

The above, other objects and novel features of the present invention will become apparent from the description of the present specification and the accompanying drawings.

Summaries of representative ones of the inventions disclosed in the present application will be described in brief as follows:

[1]<<Frequency Adjustment with External Clock Signal Frequency as Index>>

A semiconductor integrated circuit according to the present invention comprises a memory circuit (20), an oscillator circuit (23) which generates an internal clock signal (VCLK), based on control information held in the memory circuit, and a logic circuit (2, 40) which generates control information for causing the frequency of the internal clock signal to coincide with the frequency of an external clock signal (RCLK) generated outside, wherein the internal clock signal (CLK) is used for a synchronous operation of an internal circuit. Even when an error (undesired variation) occurs in the oscillation characteristic (oscillation frequency) of the oscillator circuit due to process variations, it is possible to cause an internal clock signal frequency to coincide with an external clock signal frequency corresponding to a target frequency without the need for external attachment of a crystal oscillator and the input of an external clock signal. In short, it is possible to compensate for a frequency error due to the process variations.

The capturing of the control information that causes the internal clock signal frequency to coincide with the external clock signal frequency corresponding to the target frequency is carried out in response to instructions for a predetermined operation mode. If the predetermined operation mode is designated, then the capturing of such control information can be optionally performed. The target frequency may be changed to optionally capture the control information.

As forms where the process of generating the control information by the logic circuit is performed in clock synchronism, may be mentioned, a first form synchronized with a clock signal generated based on control information initially given to the memory circuit, a second form synchronized with an external clock signal, and a third form synchronized with a clock signal generated by another oscillator circuit oscillated in response to instructions for a predetermined operation mode.

In terms of the efficiency of utilization of the control information once obtained by the logic circuit, a non-volatile memory device (6) is provided which stores the control information generated by the logic circuit. The control information stored in the non-volatile memory device is loaded into the memory circuit in response to power-on reset.

<<Generation Forms of Control Information>>

A first form makes use of a clock counter. That is, it includes a sampling circuit (31) which samples information that respond to the respective frequencies of the internal clock signal and the external clock signal. The logic circuit (2) compares the frequency of the internal clock signal with the frequency of the external clock signal using the information sampled by the sampling circuit and thereby generates control information which causes an internal clock signal frequency to coincide with an external clock signal frequency. At this time, the logic circuit is a CPU (Central Processing Unit), for example, and the memory circuit is a register accessible by the CPU.

A second form makes use of a built-in comparator. It has a comparator (24) which performs a difference comparison between the frequency of the internal clock signal and the frequency of the external clock signal. The logic circuit generates control information which allows the internal clock signal frequency to coincide with the external clock signal frequency, using the result of comparison by the comparator. At this time, the logic circuit is a CPU, for example, and the memory circuit is a register accessible by the CPU.

A third form makes use of an updown counter. That is, the memory circuit is a counter (42), and the logic circuit performs a difference comparison between the frequency of the internal clock signal and the frequency of the external clock signal and upcounts or downcounts the counter using the result of comparison.

A fourth form makes use of the external result of comparison between the frequencies. The logic circuit inputs the result of comparison made between the frequency of the internal clock signal and the frequency of the external clock signal from outside via a latch (32) or the like and generates control information which causes the internal clock signal frequency to coincide with the external clock signal frequency by reference to the input result of comparison.

<<Temperature Dependence Compensation by Use of Constant Current Region>>

A specific form of the present invention, there are provided a D/A converter (21) which analog-converts control data stored in the memory circuit with respect to a conversion reference voltage, and a bias circuit (22) which forms a bias voltage corresponding to an operating power supply voltage determined based on a voltage outputted from the D/A converter. The oscillator circuit is configured as a voltage-controlled oscillator which uses the voltage (Vfdd) determined based on the output voltage of the D/A converter as an operating power supply voltage and whose oscillation frequency is controlled by the bias voltage. At this time, the bias circuit includes a constant current circuit (M7, Rf, M8) which is provided with MOS transistors each of which meets a gate-to-source voltage condition under which a change in drain-to-source current is small with respect to a change in temperature, and which outputs drain voltages of the MOS transistors as control voltages. When the operating power supply voltage is changed based on the output voltage of the D/A converter, the constant current circuit is capable of changing the bias voltage in a range in which its change meets the gate-to-source voltage condition, and suppressing or relaxing a variation due to the change in temperature within the range. In this configuration, a frequency variable range is greatly limited in terms of the range in which the change meets the gate-to-source voltage condition. In short, the present configuration is limited to an application at a substantially constant frequency.

As a specific form, the constant current circuit includes a p channel type first MOS transistor (M7) of which the source receives a power supply voltage and whose gate and drain are short-circuited therebetween, an n channel type second MOS transistor (M8) of which the source receives a circuit's ground voltage and whose gate and drain are short-circuited therebetween, and a resistive element (Rf) having one end connected to the drain of the first MOS transistor and the other end connected to the drain of the second MOS transistor. A drain voltage of the first MOS transistor and a drain voltage of the second MOS transistor are outputted as control voltages respectively.

Considering the output of the D/A converter is low impedance, the output voltage of the D/A converter may preferably be supplied as an operating power supply voltage for the voltage-controlled oscillator and the bias circuit via a voltage follower amplifier (47). By deactivating the voltage follower amplifier upon standby, the operating power supply for the oscillator circuit and the bias circuit can be cut off, thus enabling a contribution to a reduction in power consumption.

When compensation for a variation in power supply is taken into consideration, it is desirable that a reference voltage generator (45) is further provided which generates a reference voltage that has compensated for a voltage variation with respect to variations in power supply voltage and temperature, and the D/A converter inputs the reference voltage as a conversion reference voltage.

<<Temperature Dependence Compensation by Paying Attention to VLT>>

Another form for the temperature dependence compensation further includes a D/A converter which analog-converts control data held in the memory circuit with respect to the conversion reference voltage, and a bias circuit which forms a bias voltage (VGP, VGN), based on a voltage outputted from the D/A converter. The oscillator circuit is configured as a voltage-controlled oscillator which has a CMOS circuit type ring oscillator section (51) and whose oscillation frequency is controlled by the bias voltage for current control with respect to the ring oscillator section. At this time, the bias circuit applies an operating power supply voltage in the direction to suppress a variation in logical threshold voltage of a CMOS circuit to the oscillator circuit to thereby compensate for variations in the oscillation frequency of the ring oscillator section due to a change in temperature.

As a specific form, the voltage-controlled oscillator has CMOS inverter delay stages (50) corresponding to odd-numbered stages, which constitute the ring oscillator section. The bias circuit has a logical threshold voltage simulation circuit section (65) which simulates a logical threshold voltage of each CMOS inverter stage, and varies the operating power supply voltage of the oscillator circuit using the output of the logical threshold voltage simulation circuit. When compensation for a variation in power supply is taken into consideration, it is desirable that a reference voltage generator is further provided which generates a reference voltage that has compensated for a voltage variation with respect to variations in power supply voltage and temperature, and the D/A converter inputs the reference voltage as a conversion reference voltage.

[2]<<Dynamic Automatic Adjustment to Clock Signal Frequency>>

A semiconductor integrated circuit according to another aspect of the present invention comprises a memory circuit, an oscillator circuit which generates an internal clock signal, based on control information held in the memory circuit, and a logic circuit (70) which counts the internal clock signal for each constant interval of a periodically generated pulse and updates the control information in the direction to allow the count value to coincide with an expected value. The internal clock signal is used for a synchronous operation of an internal circuit. The expected value for the count value correlates with a target frequency. Thus, an internal clock signal frequency can be dynamically and automatically adjusted according to the expected value corresponding to the target frequency with the constant interval of the periodically generated pulse as the reference. Since the oscillation frequency of the oscillator circuit is dynamically adjusted for each cycle of the pulse, temperature dependence and power supply dependence may preferably be made nonexistent with respect to the constant interval in principle.

As a specific form of the present invention, there is provided an interval generator (71) which periodically generates a constant interval of a pulse. The interval generator includes a pulse generator (72), a CR time constant circuit (73) which performs either a charge operation or a discharge operation from a predetermined phase point of a pulse generated from the pulse generator, and a detector (74) which detects that the voltage obtained by the CR time constant circuit reaches a stipulated voltage. A time interval from the predetermined phase point to the timing of detection by the detector is defined as the constant interval. Temperature dependence of the CR time constant circuit is substantially negligibly small.

It is desirable that the stipulated voltage is formed based on a reference voltage generated from a reference voltage generator, and the reference voltage is a voltage that has compensated for a voltage variation with respect to variations in power supply voltage and temperature. Power supply dependence also becomes nonexistent with respect to the constant interval. No substantial problem arises even when the power supply dependence and temperature dependence exist in the oscillator circuit.

As another specific form of the present invention, the memory circuit is an updown counter (42), for example. The updown counter performs upcount or downcount in synchronism with a pulse generated from the pulse generator.

As a further specific form of the present invention, a D/A converter which analog-converts control data held in the memory circuit with respect to a conversion reference voltage, and a bias circuit which forms a bias voltage varied according to a voltage outputted from the D/A converter are further provided. The oscillator circuit is a voltage-controlled oscillator whose oscillation frequency is controlled by the bias voltage. If consideration is made to compensation for power supply dependence with respect to the D/A converter, then the D/A converter may input the reference voltage generated by the reference voltage generator as a conversion reference voltage.

As a still further specific form of the present invention, a non-volatile memory device is further provided. The non-volatile memory device holds control information initially loaded into the memory circuit in response to power-on reset and the expected value loaded into the logic circuit. Control information and expected values may be stored in a non-volatile memory in advance upon shipment of a semiconductor integrated circuit. If the non-volatile memory is electrically reprogrammable, then a user is able to optionally select an oscillation frequency by rewriting at least an expected value.

[3]<<Divider>>

A divider may be provided which divides the clock signal outputted from the oscillator circuit. It is desirable that the divider is a variable divider. Upon shipment of the semiconductor integrated circuit, control information is stored in the non-volatile memory such that an internal oscillation frequency coincides with the highest operating frequency. A user may select an optional frequency using a variable divider.

DETAILED DESCRIPTION OF THE PREFERRED EMBODIMENTS

<<Microcomputer>>

Figure 1:
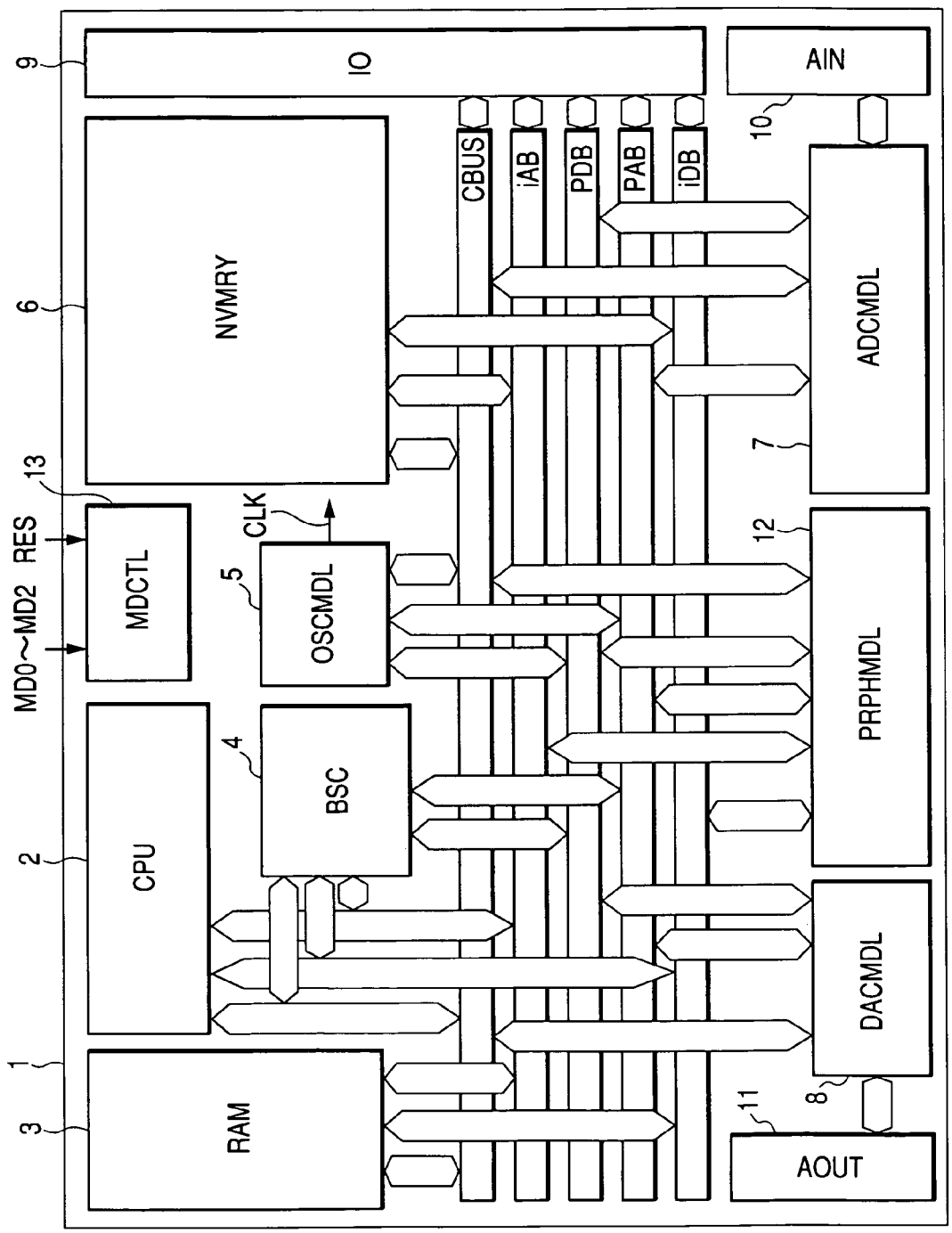
FIG. 1 is a block diagram illustrating a microcomputer according to one embodiment of the present invention.

FIG. 1 illustrates a microcomputer according to one embodiment of the present invention. The microcomputer 1 shown in the same drawing is formed over one semiconductor substrate (semiconductor chip) like monocrystalline silicon by, for example, a CMOS integrated circuit manufacturing technology.

Although not restricted in particular, the microcomputer 1 includes a control signal bus CBUS, an internal address bus iAB, an internal data bus iDB, a peripheral address bus PAB and a peripheral data bus PDB. Predetermined circuit modules are respectively connected to them. As the above circuit modules, the microcomputer 1 has a central processing unit (CPU) 2, a random access memory (RAM) 3 used in a work area or the like of the CPU 2, a bus state controller (BSC) 4, an internal oscillator circuit module (OSCMDL) 5, an electrically reprogrammable non-volatile memory (non-volatile memory device: NVMRY) 6 such as a flash memory, an analog-digital conversion module (ADCMDL) 7, a digital-analog conversion module (DACDML) 8, a general-purpose input/output port (IO) 9, an analog input circuit (AIN) 10 connected to the ADC 7, an analog output circuit (AOUT) 11 connected to the DAC 8, a mode controller (MDCTL) 13 and other peripheral circuit modules (PRPHMDL) 12 which include a timer modules, a serial interface circuit, for example, or the like.

The CPU 2 includes an instruction controller which fetches an instruction and decodes the fetched instruction to generate a control signal, and an execution unit or section which performs an arithmetic process or the like, using an operand in accordance with the control signal. The NVMRY 6 holds control data, a control program of the CPU 2, etc. The OSCMDL 5 performs internal oscillations without the need for external attachment of an oscillator to thereby generate a clock signal CLK. The clock signal CLK is used for an operation reference clock signal or the like at the time that each built-in circuit module is clock-synchronously operated. Although one clock signal is typically illustrated as CLK in the present embodiment, several types of clock signals different in frequency are actually generated corresponding to the case where circuit modules different in operating speed are included and the operating speed is varied according to operation modes, etc., and supplied to their corresponding circuit modules. The MDCTL 13 is supplied with mode signals MD0 through MD2 via mode terminals and a reset signal RES via reset terminals. When instructions for reset are made to the microcomputer 1 in accordance with the reset signal RES or the like, the on-chip circuit module such as the CPU 2 is initialized. When the instructions for performing the reset by the reset signal RES are released, the CPU 2 reads an instruction from a predetermined start address and starts the execution of a program. The start address is determined according to each of the operation modes instructed by the mode signals MD0 through MD2 or the like.

<<Compensation for Variations in Frequency Due to Process Variations>>

Figure 2:
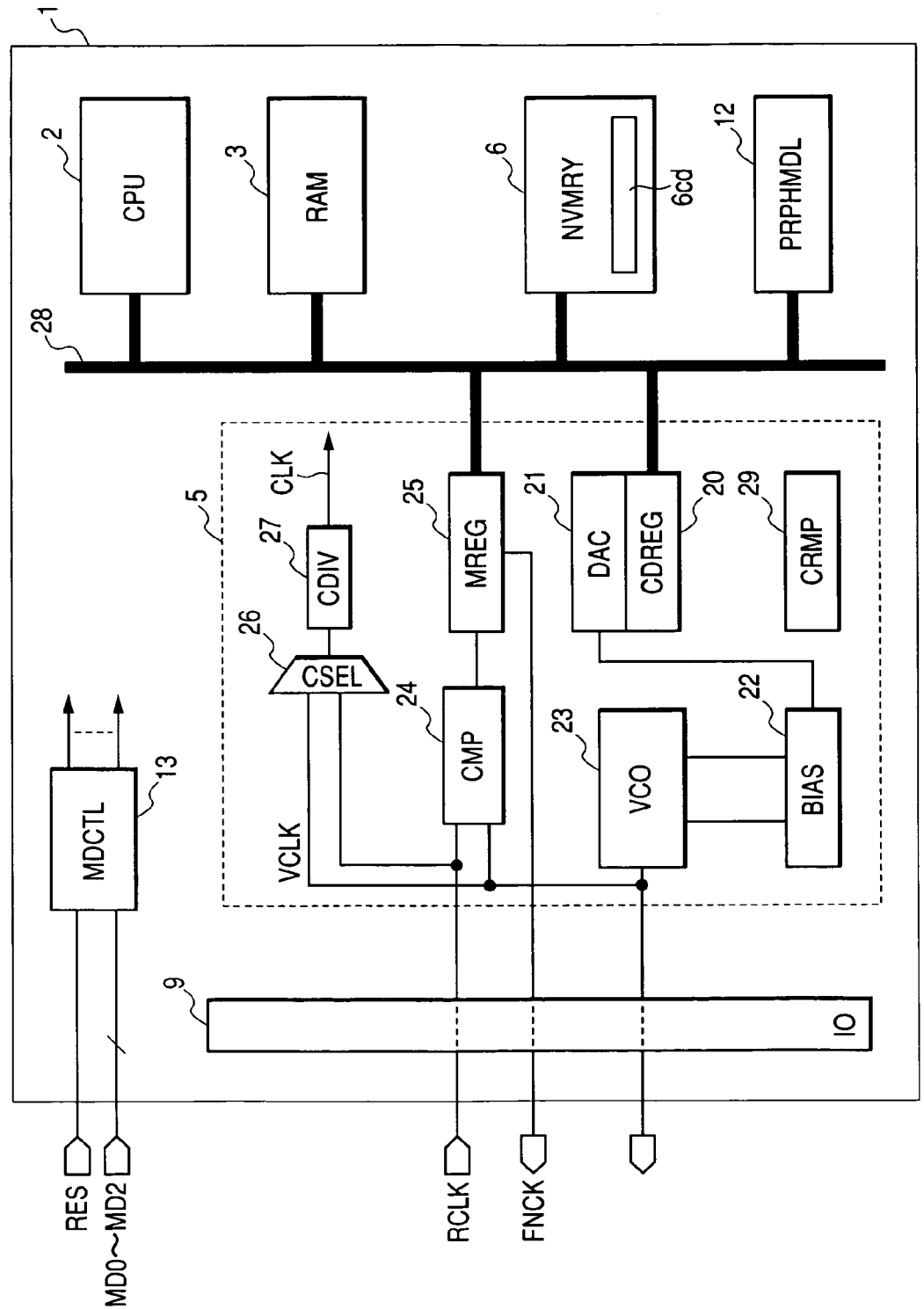
FIG. 2 is a block diagram showing a first example of an internal oscillator circuit module.

A first example of the internal oscillator circuit module 5 is shown in FIG. 2. The internal oscillator circuit module 5 includes a control data register (CDREG) 20 used as a memory circuit, a digital-analog converter (DAC) 21 which digital-to-analog converts control information loaded in the CDREG 20, a bias circuit (BIAS) 22 which forms a control voltage in response to the output of the D/A converter 21, a voltage-controlled oscillator (VCO) 23 which oscillates at a frequency corresponding to the control voltage, a comparator (CMP) 24 capable of comparing the frequency of an internal clock signal VCLK generated by the voltage-controlled oscillator 23 and that of an external clock signal RCLK, a monitor register (MREG) 25 which holds the result of comparison by the comparator 24, a clamp power supply circuit (CRMP) 29 used for a conversion reference voltage or the like for D/A conversion, a selector (CSEL) 26 which selects either the internal clock signal or the external clock signal, and a divider (CDIV) 27 which divides the output of the selector 26. The control data register 20 and the monitor register 25 are disposed in an address space of the CPU 2 and made accessible via an internal bus 28. The bus 28 is defined as a generic name for the control signal bus CBUS, the internal address bus iAB, the internal data bus iDB, the peripheral address bus PAB and the peripheral data bus PDB. The selection of the clock by the clock selector 26 is controlled by the mode controller 13. A division ratio of the divider 27 is set to an initial value according to the reset operation and thereafter varied via the execution of the instruction by the CPU 2. The monitor register 25 shares even a register that outputs a clock fetch-in signal FNCK for notifying the completion of a frequency setting operation based on a frequency setting mode to the outside. An input terminal for the external clock signal RCLK, an output terminal for the clock fetch-in signal FNCK and an output terminal for the internal clock signal VCLK may be dedicated terminals or shared terminals.

On power-on resetting, the mode controller MDCTL loads control information from a predetermined area 6cd of the non-volatile memory 6 into the control data register 20. When one of the operation modes instructed by the mode signals MD0 through MD2 is selected as the frequency setting mode, the selector 26 selects the external clock signal RCLK upon reset release and the CPU 2 executes a frequency setting program in synchronism with the clock signal CLK based on the external clock signal RCLK. A control voltage is formed based on the DA-converted output outputted from the DAC 21 in accordance with the control information initially set to the CDREG 20, whereby the oscillation frequency of the VCO 23 is determined. The CPU 2 regularly refers to the monitor register 25 and determines whether the result of comparison by the frequency comparator 24 is brought to the coincidence. When the result of comparison is brought to the non-coincidence, the CPU 2 obtains access to the control data register 20 and updates the control information in the direction so as to cause an internal clock signal frequency to coincide with an external clock signal frequency. When the result of determination is brought to the coincidence, the CPU 2 stores the control information of the control data register 20 in the predetermined area 6cd of the non-volatile memory 6 and terminates the execution of the frequency setting program. When the execution of the frequency setting program is completed, the CPU 2 outputs a clock fetch-in end signal FNCK to the outside via the MREG 25. In response to it, the outside stops the generation of the clock signal RCLK and the like.

When one of the operations modes specified by the mode signals MD0 through MD2 is selected as the normal mode, the selector 26 selects the internal clock signal upon reset release. Since the control information obtained in the frequency setting mode and stored in the non-volatile memory 6 is already initially-loaded into the control data register 20 upon power-on resetting, the vcb 23 is capable of performing an oscillating operation, based on control information obtained in the frequency setting mode upon reset release, and the microcomputer 1 is capable of performing data processing in sync with the clock signal CLK defined based on the internal clock signal VCLK. Thus, since the control information stored in the predetermined area 6cd of the non-volatile memory 6 is loaded into the control data register 20 and re-used, the internal clock signal VCLK having the target frequency identical to that of the external clock signal RCLK can be generated by the internal oscillator circuit module 5 alone. That is, even when an error occurs in the oscillation characteristic of the VCO 23 due to process variations, the VCO 23 can be oscillated at the target frequency without the need for external attachment of a crystal oscillator and the input of an external clock signal. It is possible to compensate for variations (variations in oscillation frequency) in oscillation characteristic due to the process variations.

When one of the operation modes designated by the mode signals MD0 through MD2 is of a first test mode upon reset release, the selector 26 selects an external clock signal. When the operation mode is of a second test mode, the selector 26 selects an internal clock signal.

Figure 15:
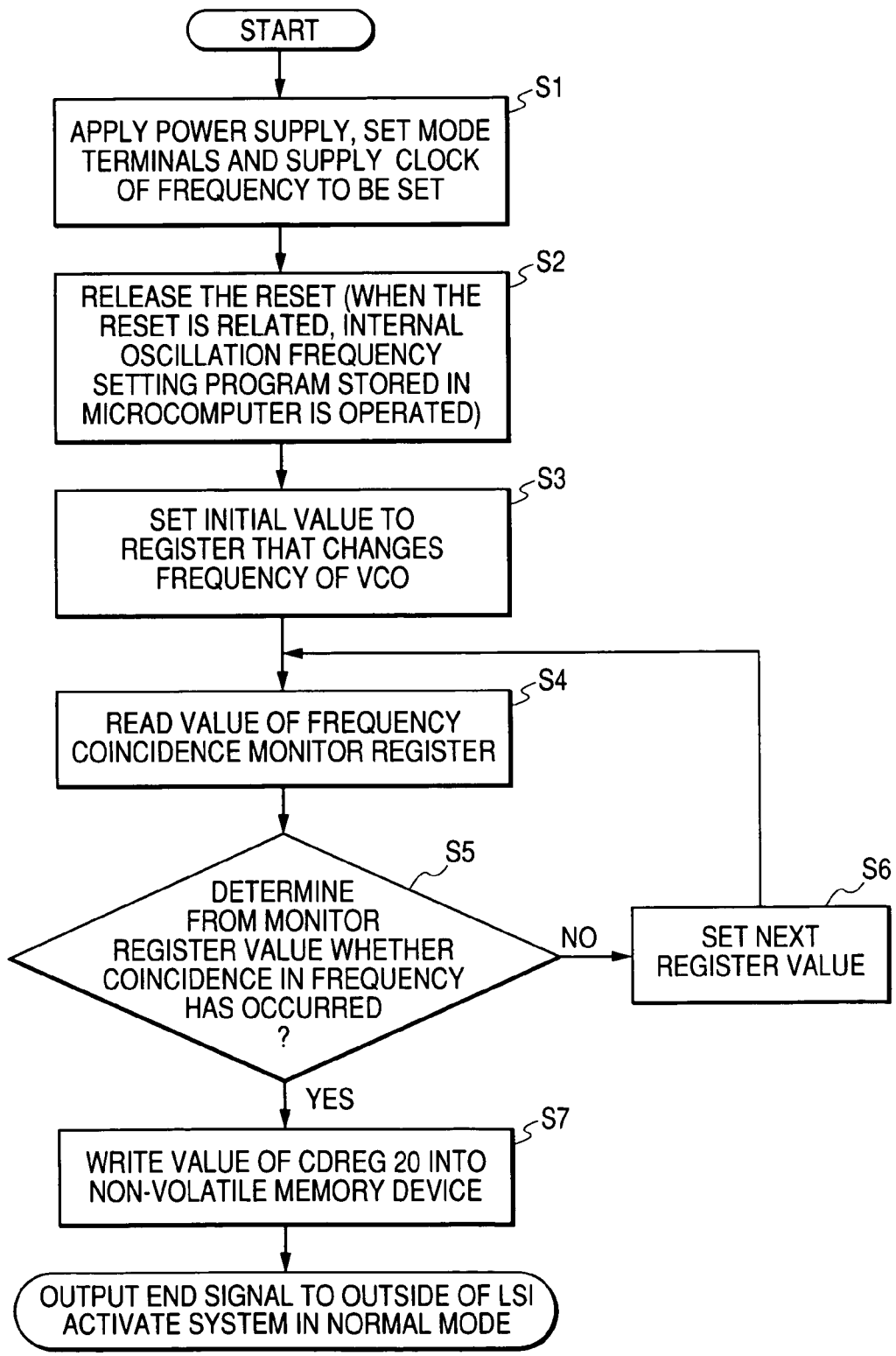
FIG. 15 is a flowchart illustrating an internal oscillation frequency setting operation described in FIG. 2.

A flowchart for describing the internal oscillation frequency setting operation referred to above is illustrated in FIG. 15. A power supply is applied, the mode signals MD0 through MD2 are inputted and the external clock signal RCLK is inputted. Thus, the microcomputer 1 is power-on reset (S1). When the reset is released, the CPU 2 starts to execute the frequency setting program (S2) in accordance with the mode signals MD0 through MD2 for specifying the frequency setting mode. The CPU 2 sets an initial value of control information to the CDREG 20 in accordance with the frequency setting program (S3). Thereafter, the CPU 2 reads the value of the MREG 25 (S4) and determines whether the internal clock signal frequency coincides with the external clock signal frequency (S5). When they are found not to coincide with each other, the CPU 2 sets the following control information to the CDREG 20 (S6). When the coincidence thereof is detected, the CPU 2 stores the control information of the CDREG 20 in the predetermined area 6cd of the non-volatile memory 6 and notifies the completion of processing to the outside (S7). Afterwards, the CPU 2 is capable of operation in the normal mode (user mode) or the like after its resetting.

Figure 3:
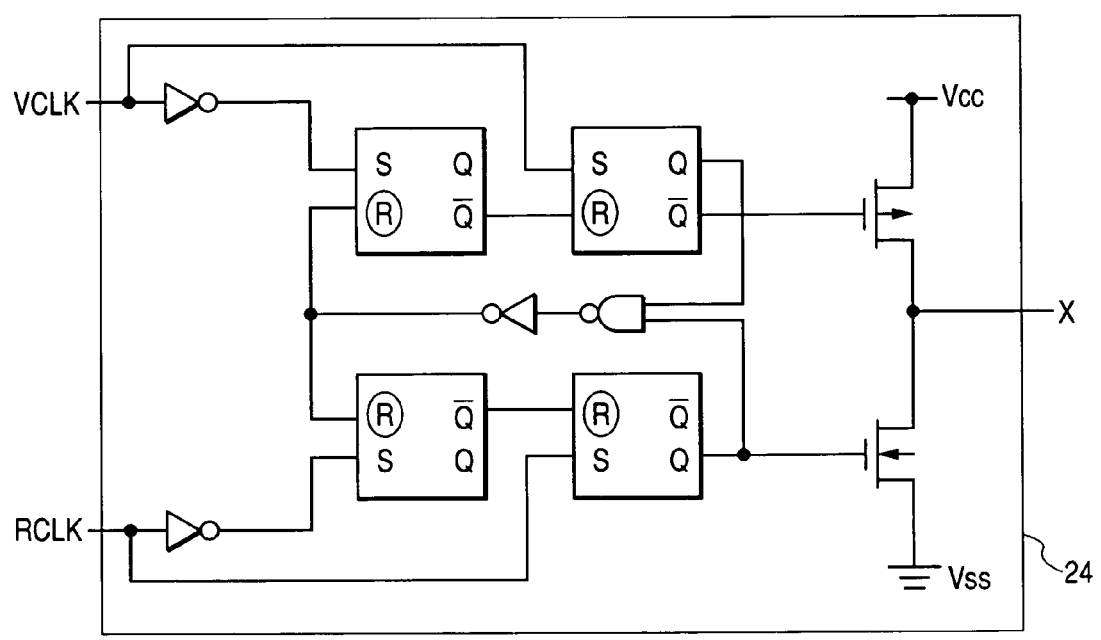
FIG. 3 is a logic circuit diagram showing one example of a comparator 24.

One example of the comparator 24 is shown in FIG. 3. The comparator 24 shown here intends to detect the difference in frequency by phase comparison. That is, the difference in phase between the internal clock signal VCLK and the external clock signal RCLK is detected by four reset priority-type RS type flip-flops. When the phase of the internal clock signal VCLK leads the phase of the external clock signal RCLK, an output X is brought to a high level (logical value "1"). When the phase of the internal clock signal VCLK lags that of the external clock signal RCLK, it is brought to a low level (logical value "0"). In the case other than those, the output X is brought to high impedance. The monitor register 25 latches the result of phase comparison with predetermined timing on a regular basis. Although not illustrated in particular, a clock counter and a magnitude comparator may be used to configure the comparator 24. That is, a first counter that inputs the internal clock signal VCLK at its clock terminal and a second counter that inputs the external clock signal RCLK at its clock terminal are provided. Counter clear, count start instructions, count stop instructions, count value output and comparisons of magnitude between output count values by the magnitude comparator are effected on both counters on a parallel basis. Then, the result of comparison may be held in the monitor register 25.

Figure 4:
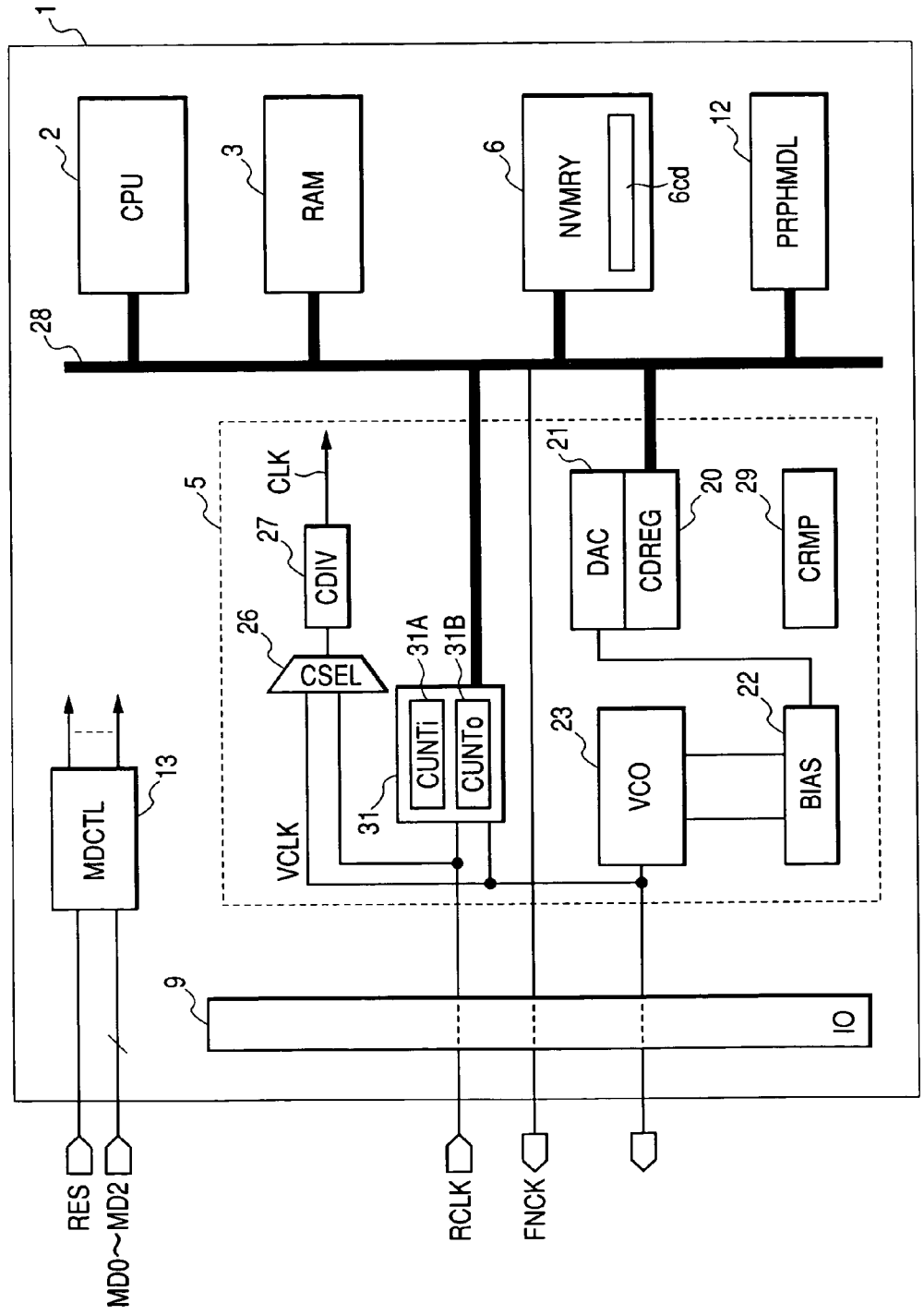
FIG. 4 is a block diagram showing a second example of an internal oscillator circuit module.

A second example of an internal oscillator circuit module 5 is shown in FIG. 4. The present example includes a sampling circuit 31 as an alternative to the CMP 24 and MREG 25 shown in FIG. 2. The sampling circuit 31 includes a first counter (CUNTi) 31A which inputs an internal clock signal VCLK at its clock terminal, and a second counter (CUNTo) 31B which inputs an external clock signal RCLK at its clock terminal. At this time, the CPU 2 regularly performs operations such as clearing of the first and second counters 31A and 31B, count start instructions, count stop instructions, reading of count values and the comparison between the read values as an alternative of the routine read operation of the monitor register 25, which is carried out in response to the frequency setting mode. Since the operation corresponding to the result of comparison is identical to FIG. 2, its detailed description is omitted. Although a processing burden on the CPU 2 increases slightly, an effect similar to FIG. 2 is obtained. The sampling circuit 31 may substitute the configuration using the clock counter with such a configuration that a comparison is made between the phases of the internal clock signal and the external clock signal, the result of comparison is held in the corresponding latch, and the CPU 2 is made accessible thereto. At this time, for example, the circuit or the like shown in FIG. 3 may be used for the phase comparison. Even in the case where the internal oscillator circuit module 5 shown in FIG. 4 is utilized, a flow for an internal oscillation frequency setting operation becomes similar to FIG. 15.

Figure 5:
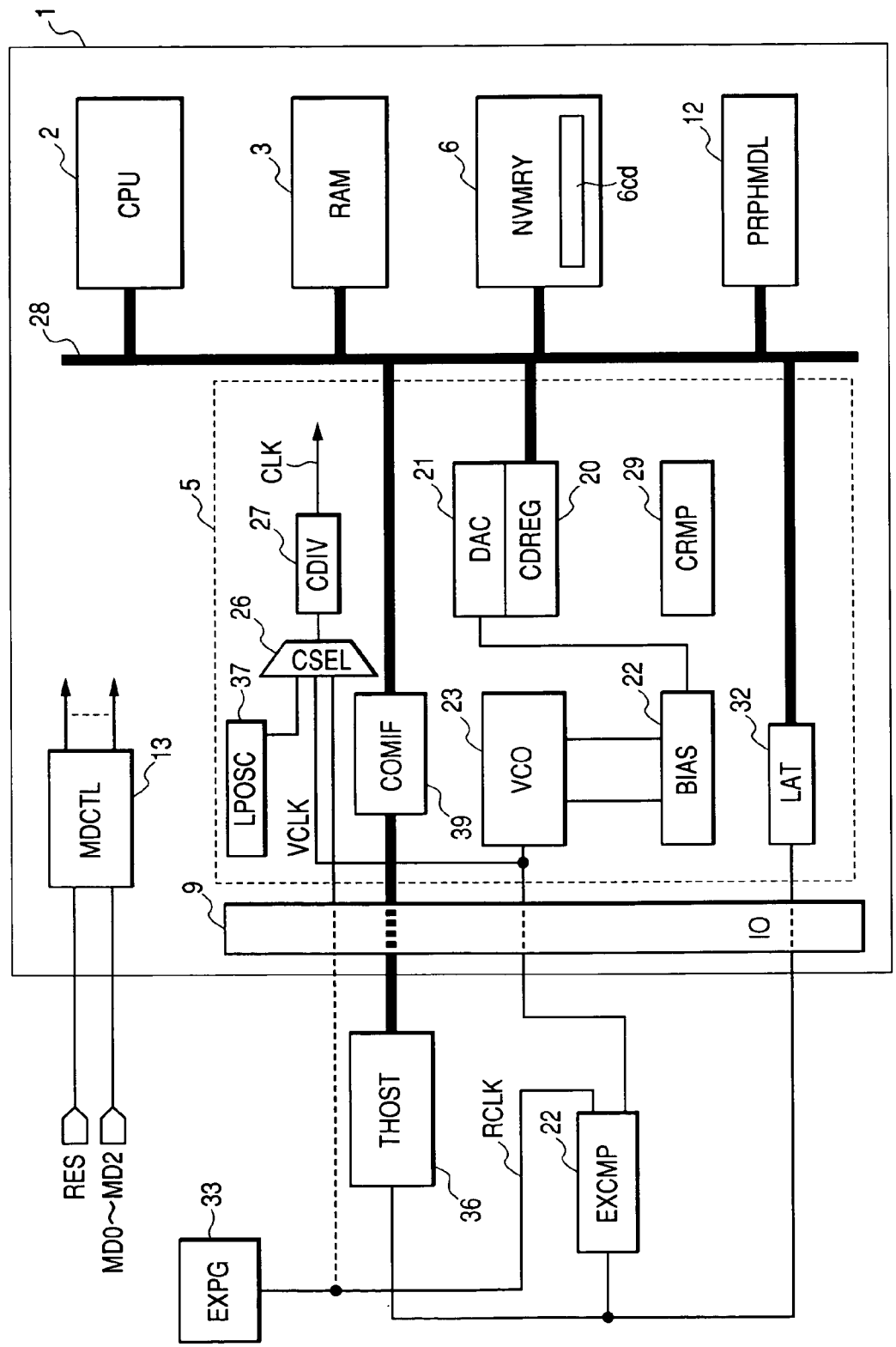
FIG. 5 is a block diagram depicting a third example of an internal oscillator circuit module.

A third example of an internal oscillator circuit module 5 is shown in FIG. 5. The present example makes use of a configuration wherein a frequency comparison is made outside and a control program of the CPU 2, which is necessary in a frequency setting mode, is inputted from an external test host (THOST) 36. The present example includes a communication interface (COMIF) 39 which receives the control program of the CPU 2 from outside via the test host 36 or the like, and a latch (LAT) 32 which receives the result of comparison executed outside. A frequency comparator (EXCMP) 35 is provided outside which compares the frequency of an external clock signal RCLK generated by a pulse generator (EXPG) 33 with that of an internal clock signal VCLK generated by the VCO 23 for the purpose of frequency comparison. When the frequency setting mode is set to the microcomputer 1, the CPU 2 is clock-synchronously operated using the external clock signal RCLK to down-load a frequency setting control program from outside via a communication interface 31 and stores the down-loaded control program in, for example, a predetermined area of the RAM 3. The CPU 2 executes the control program stored in the RAM 3 and fetches therein the result of comparison held in the latch 32 at predetermined intervals. Until an internal clock signal frequency coincides with an external clock signal frequency, the CPU 2 performs the process of causing a control data register 20 to receive control data updated in the direction to allow an internal clock signal frequency to coincide with an external clock signal frequency from the THOST 36 and updating the internal clock signal frequency. Since other frequency setting operation is identical to FIG. 2, its detailed description is omitted.

In particular, FIG. 5 includes a low precision oscillator (LPOSC) 37 low in oscillation frequency accuracy. A clock selector (CSEL) 38 is capable of selecting an oscillation output of the oscillator 37, the external clock signal RCLK or the internal clock signal VCLK. In a clock frequency setting mode, for example, the clock selector 38 may select the output of the oscillator 37 in place of the external clock signal RCLK. The term of "the oscillation frequency accuracy is low" means that compensation for variations in oscillation frequency with respect to process variations, a variation in power supply voltage and a change in temperature has not been performed. The VCO can compensate for variations in oscillation frequency with respect to a variation in power supply voltage and a change in temperature as will be descried in detail later.

Figure 16:
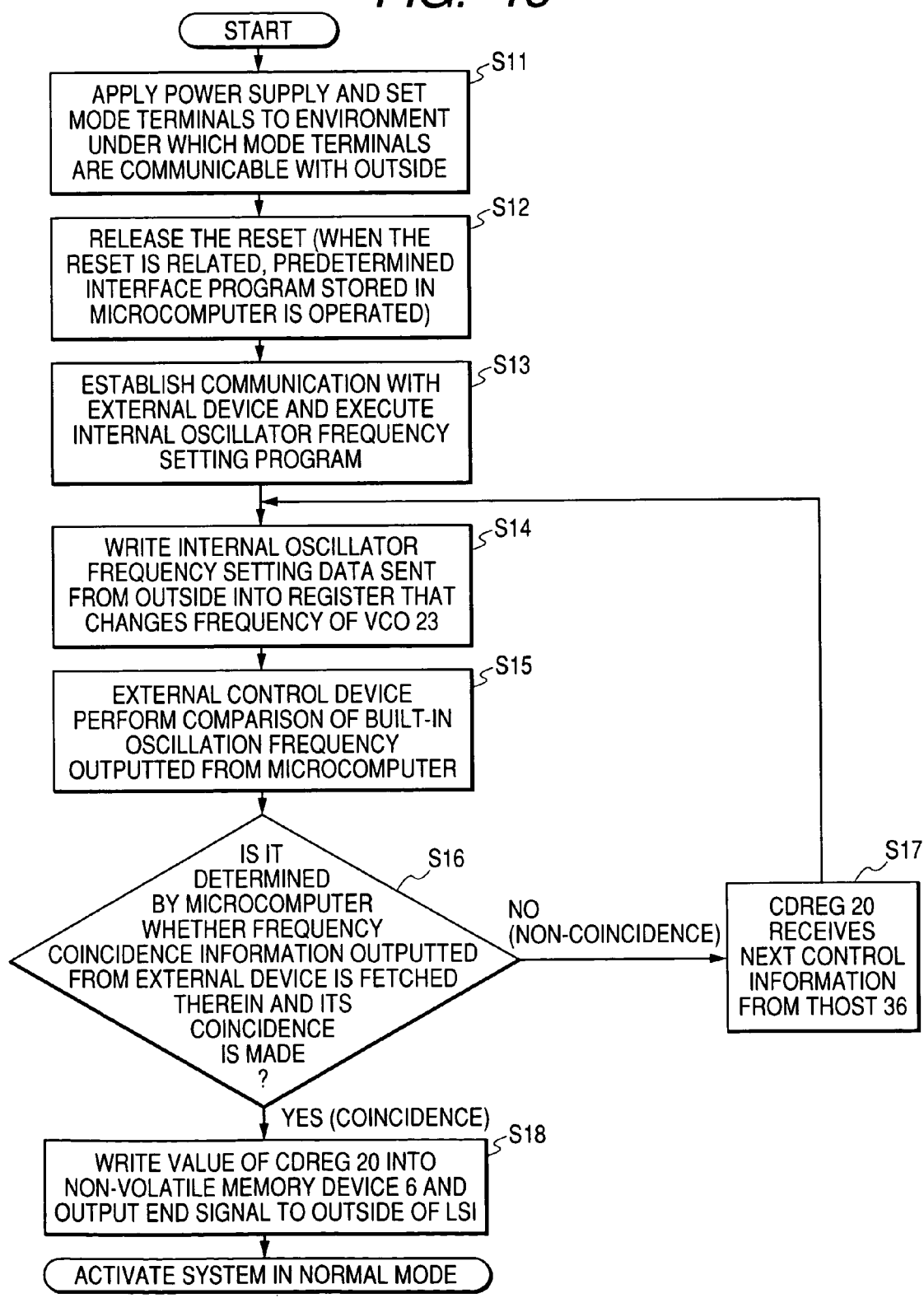
FIG. 16 is a flowchart illustrating an internal oscillation frequency setting operation based on an external comparison.

A flowchart for describing an internal oscillation frequency setting operation based on an external comparison is shown in FIG. 16. The power supply is applied, the mode signals MD0 through MD2 are inputted and the external clock signal RCLK is inputted, so that the microcomputer 1 is power-on reset (S11) When the reset is released, the CPU 2 starts to execute a predetermined interface program in accordance with the states of the mode signals MD0 through MD2 for specifying the frequency setting mode (S12). The CPU 2 establishes communication with the THOST 36, transfers the frequency setting control program to the RAM 3 and starts to execute the transferred frequency setting control program (S13). The CPU 2 sets control information supplied from outside to the CDREG 20 in accordance with the control program (S14). The THOST 36 compares the internal clock signal frequency with the external clock signal frequency (S15). The microcomputer 1 captures the external result of comparison and determines whether the internal clock signal frequency coincides with the external clock signal frequency (S16). If they are found not to coincide with each other, then the CPU 2 causes the CDREG 20 to receive the following control information from the THOST 36 (S17). When they are found to coincide with each other, the CPU 2 stores the control information of the CDREG 20 in the predetermined area 6cd of the non-volatile memory 6 and notifies the completion of processing to the THOST 36 (S18). Afterwards, the CPU 2 is capable of operation in the normal mode (user mode) or the like after its resetting.

Figure 6:
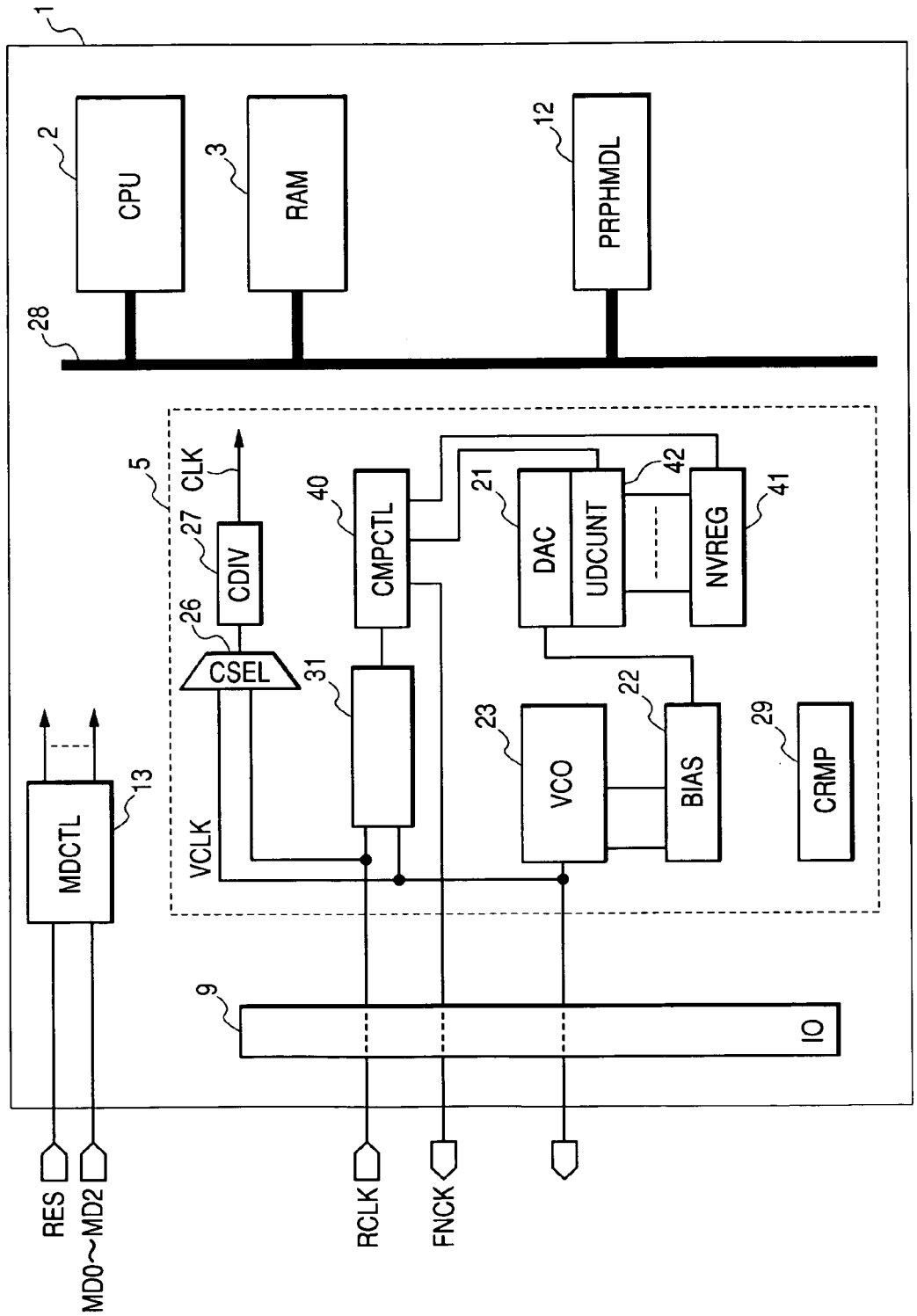
FIG. 6 is a block diagram illustrating a fourth example of an internal oscillator circuit module.

A fourth example of an internal oscillator circuit module 5 is shown in FIG. 6. The present example is configured in such a manner that the updating of control information with respect to the result of frequency comparison is carried out inside the internal oscillator circuit module 5 without using the CPU 2. The internal oscillator circuit module 5 includes, for example, the sampling circuit 31, a comparison controller (CMOCTL) 40, an updown counter (UDCUNT) 42 and a non-volatile register (NVREG) 41 for the purpose of frequency comparison. A mode controller MDCTL presets control information from the non-volatile register 41 to the updown counter 42 upon power-on reset. Thus, a VCO 23 is capable of performing an oscillating operation in accordance with a bias voltage formed based on the preset control information. When one of operation modes specified by mode signals MD0 through MD2 is selected as a frequency setting mode when the reset is released, the comparison controller (CMOCTL) 40 is started up, a selector 26 selects an external clock signal RCLK and a microcomputer 1 is capable of operation in sync with a clock signal CLK based on the external clock signal RCLK. The sampling circuit 31 samples count values of an internal clock signal VCLK and the external clock signal RCLK, and the comparison controller 40 sequentially inputs the count values and performs a comparison of magnitude between the two. When the result of magnitude comparison is brought to the non-coincidence, the comparison controller 40 effects upcount or downcount on the UDCUNT 42 to thereby allow the frequency of the internal clock signal to approach that of the external clock signal. When the result of magnitude comparison is brought to the coincidence, the comparison controller 40 internally transfers the control information held in the UDCUNT 42 to the NVREG 41 and allows the NVREG 41 to retain the control information. Further, the comparison controller 40 notifies the completion of a frequency setting operation to the outside in accordance with a signal FNCK, thereby terminating the processing.

Figure 17:
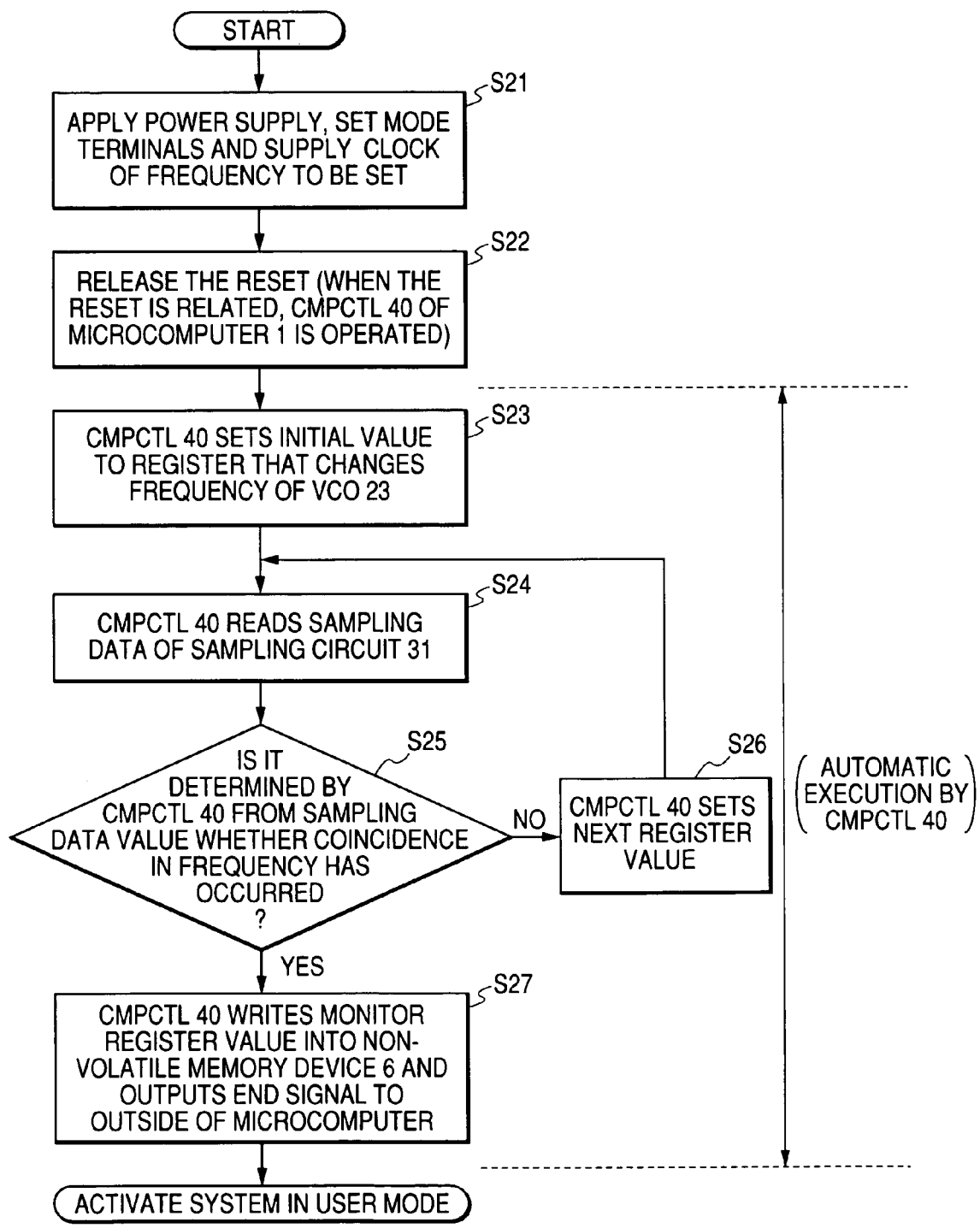
FIG. 17 is a flowchart illustrating an internal oscillation frequency setting operation by the example of FIG. 6 which performs a frequency comparison determining operation without using a CPU.

A flowchart illustrating an internal oscillation frequency setting operation by the example of FIG. 6 which performs a frequency comparison determining operation without using the CPU 2 is illustrated in FIG. 17. The power supply is applied, the mode signals MD0 through MD2 are inputted and the external clock signal RCLK is inputted. Thus, the microcomputer 1 is power-on reset (S21). When the reset is released, the CMPCTL 40 starts to operate in accordance with the states of the mode signals MD0 through MD2 for specifying the frequency setting mode (S22). The CMPCTL 40 sets an initial value of control information to the CDREG 20 (S23). Thereafter, the CMPCTL 40 reads sampling data supplied from the sampling circuit 31 (S24) and determines whether the internal clock signal frequency coincides with the external clock signal frequency (S25). When they are found not to coincide with each other, the CMPCTL 40 sets the following control information to the CDREG 20 (S26). When the coincidence thereof is detected, the CMPCTL 40 stores the control information of the CDREG 20 in the predetermined area 6cd of the non-volatile memory 6 and notifies the completion of processing to the outside (S27). Afterwards, the CMPCTL 40 is capable of operation in the normal mode (user mode) or the like after its resetting.

Figure 7:
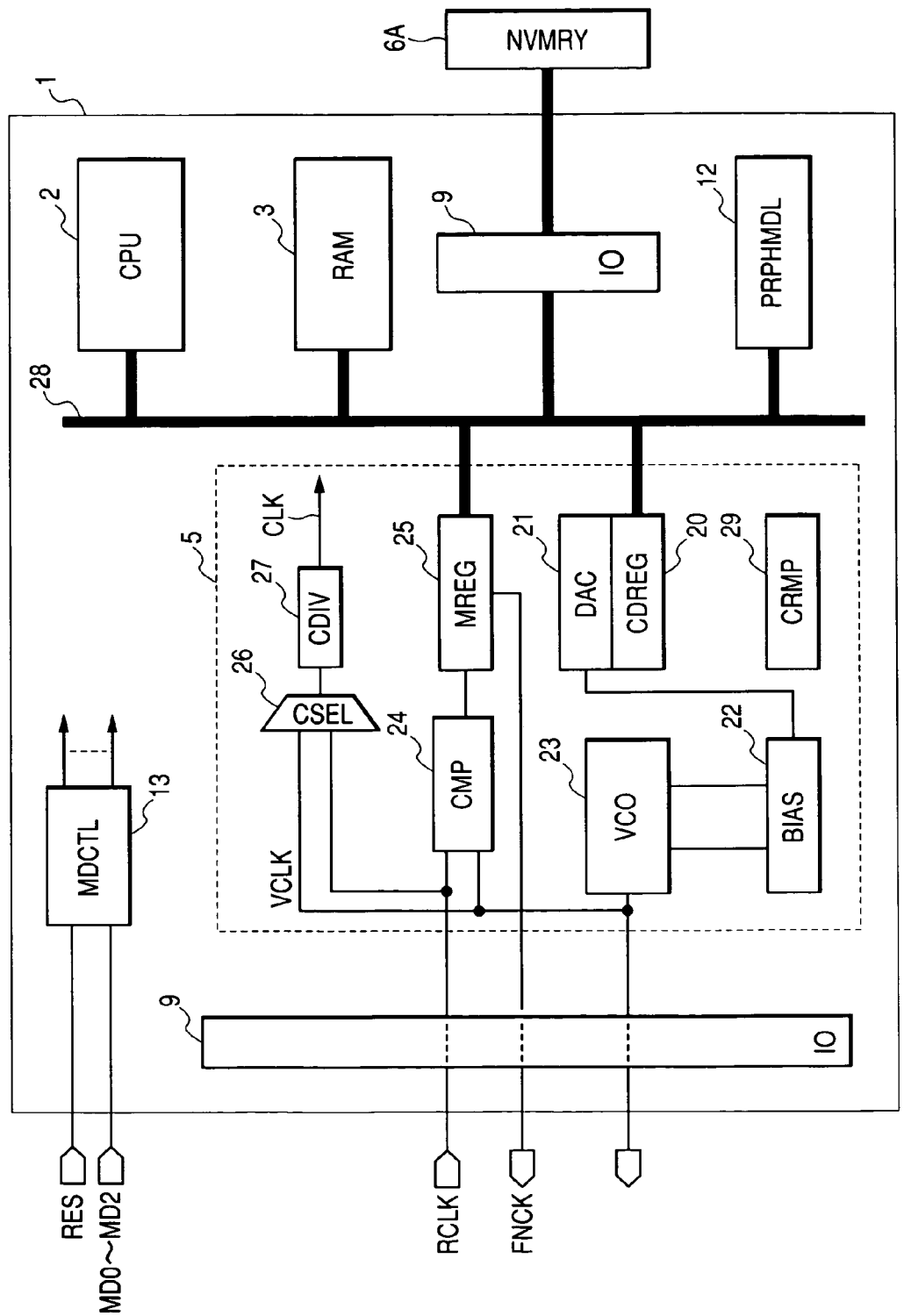
FIG. 7 is a block diagram showing a fifth example of an internal oscillator circuit module.

A fifth example of an internal oscillator circuit module 5 is shown in FIG. 7. The present example is equivalent to one wherein control information is stored in an external non-volatile memory 6A of a microcomputer 1. The non-volatile memory 6A is used to initially load control information at power-on reset and store control information obtained in a frequency setting mode. The present example is similar to FIG. 2 in other configuration. The external non-volatile memory 6A is applicable even to the configurations shown in FIGS. 4 through 6.

<<Compensation for Operating Power Supply Voltage of Oscillator Circuit and Compensation for Temperature>>

Figure 8:
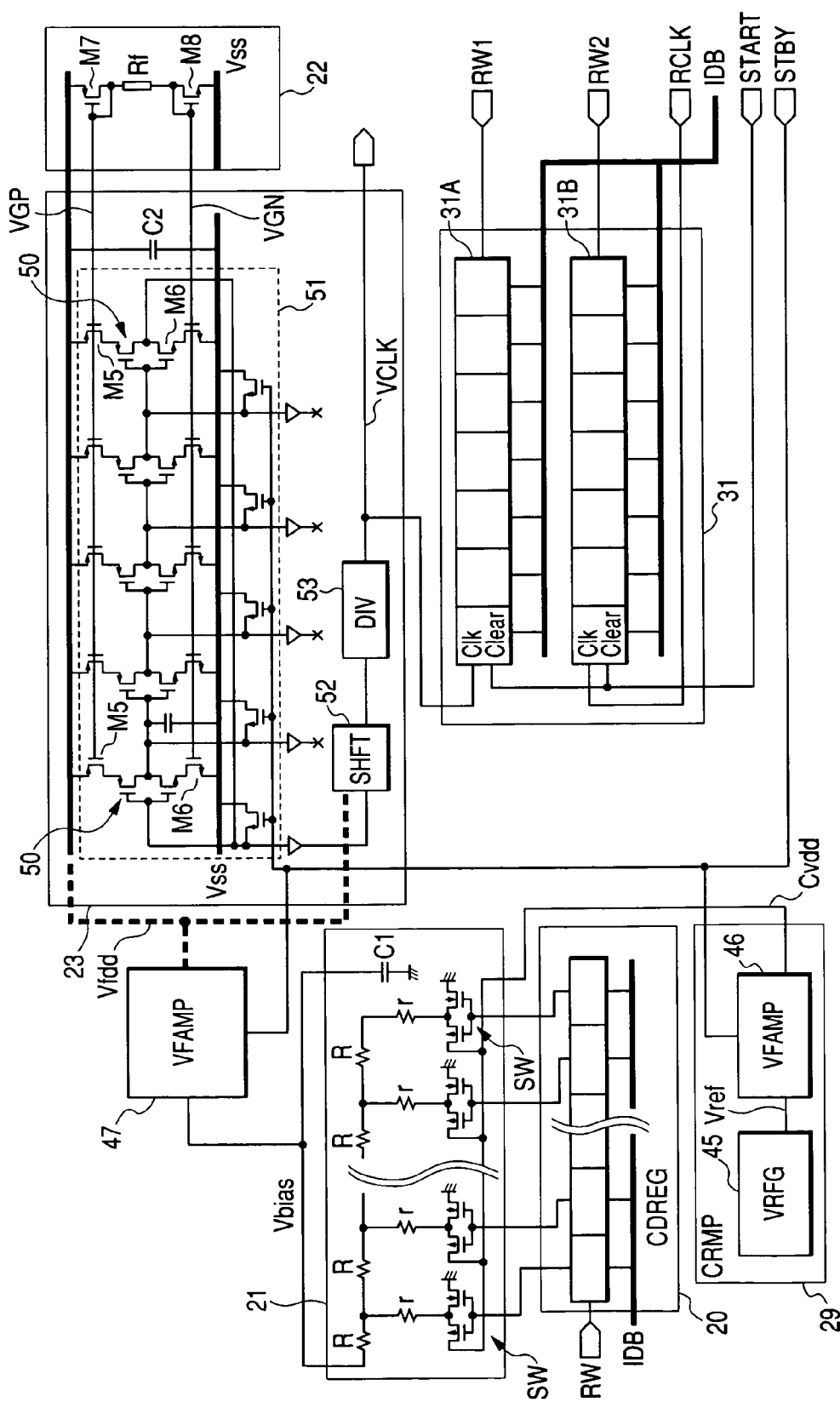
FIG. 8 is a circuit diagram illustrating a detailed circuit corresponding to the internal oscillator circuit module shown in FIG. 4.
Figure 9:
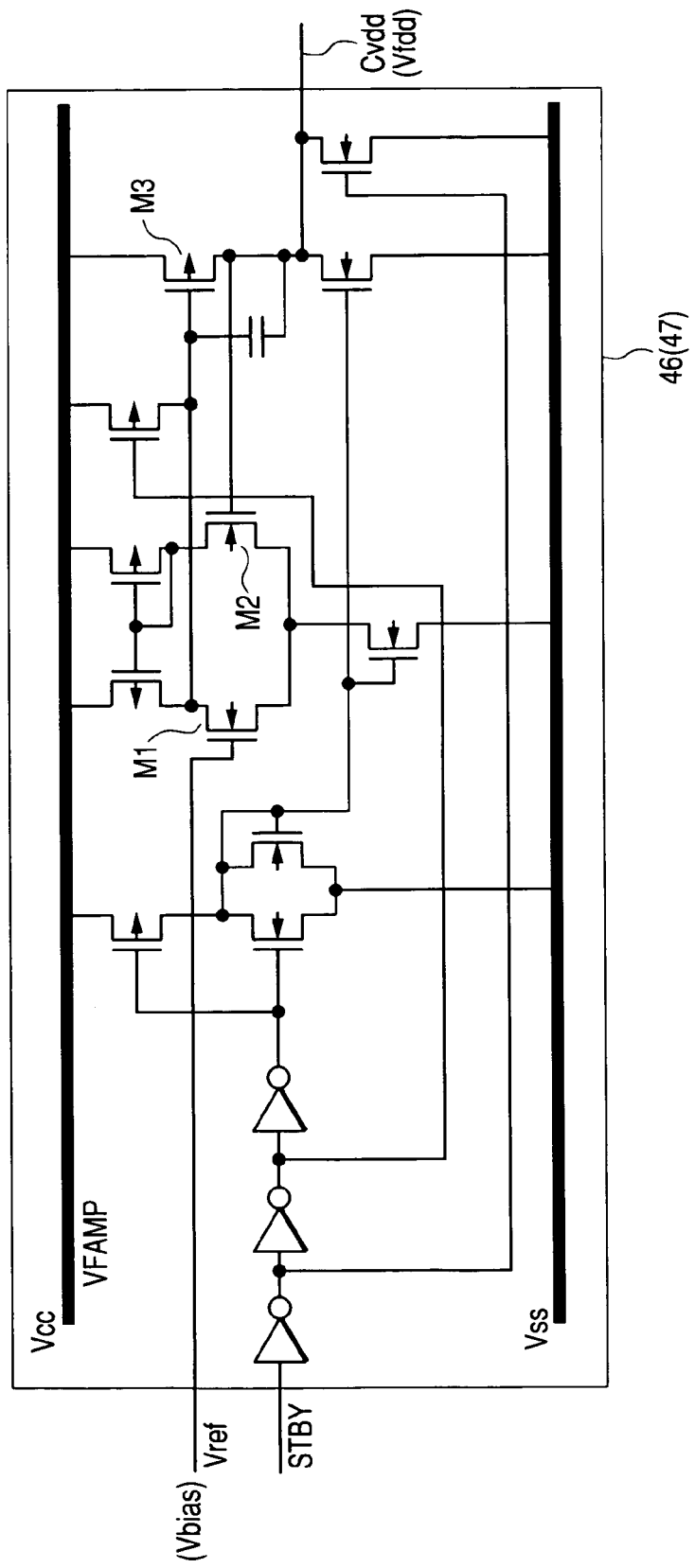
FIG. 9 is a circuit diagram depicting one example of a voltage follower amplifier (VFAMP)

A detailed circuit example corresponding to the internal oscillator circuit module 5 shown in FIG. 4 is shown in FIG. 8. The clamp circuit 29 comprises a reference voltage generator (VRFG) 45 and a voltage follower amplifier (VFAMP) 46. The reference voltage generator 45 generates a reference voltage Vref whose variation in voltage has been compensated for changes in temperature and power supply voltage. The reference voltage generator 45 generates a reference voltage through the use of the difference in threshold voltage between a pair of MOS transistors, for example. As illustrated in FIG. 9 by way of example, the voltage follower amplifier 46 principally comprises a differential amplifier having difference input MOS transistors M1 and M2 of which the M1's gate is supplied with the reference voltage Vref and the M2's gate is feedback-connected with the drain of an output MOS transistor M3. When a standby signal STBY is brought to a high level, the voltage follower amplifier 46 is deactivated with cutting off of its current dc path. The clamp circuit 29 is capable of outputting a clamp voltage Cvdd stable toward variations in temperature and power supply voltage Vcc (which has been compensated for a variation in voltage).

The clamp voltage Cvdd is utilized as a conversion reference voltage of a DAC 21. The DAC 21 has a resistance network of series resistors R and shunt resistors r, for example, and is provided as a so-called R2R-form circuit configuration wherein the clamp voltage Cvdd is applied to one ends of the respective shunt resistors r through CMOS switches SW turned on and off in response to control information. Each of the CMOS switches SW is switch-controlled by its corresponding bit of a CDREG 20. C1 designates a stabilized capacitor. RW designates a read/write control signal with respect to the CDREG 20.

Thus, a voltage Vbias outputted from the DAC 21 in accordance with the control information also becomes a voltage stable toward the variations in temperature and power supply voltage Vcc. Since the output of the D/A converter 21 is low impedance, the voltage Vbias is set as a operating power supply voltage Vfdd for a VCO 23 and a BIAS 22 through a voltage follower amplifier (VFAMP) 47 having such a circuit configuration as shown in FIG. 9. The operating power supply voltage Vfdd for the BIAS 22 along with the VCO 23 is made stable toward the variations in temperature and power supply voltage Vcc. In short, compensation for the operating power supply voltage of the VCO 23 is made.

The VCO 23 has a ring oscillator section 51 comprising an odd number of CMOS inverter delay stages 50. The CMOS inverter delay stages 50 are configured so as to have p channel type current-limit MOS transistors M5 on the operating power supply side of a CMOS inverter and have n channel type current-limit MOS transistors M6 on the circuit's ground voltage side. The gates of the current-limit MOS transistors M5 are supplied with a bias voltage VGP and the gates of the current-limit MOS transistors M6 are supplied with a bias voltage VGN so that the conductances of the CMO inverter delay stages 50 are controlled. When the standby signal STBY is high in level, the ring oscillator section 51 stops oscillating. When the standby signal STBY is inverted to a low level, the ring oscillator section 51 starts to oscillate. A transient response time interval of each CMOS inverter delay stage 50 is controlled by the bias voltages VGP and VGN, whereby the oscillation frequency of the VCO 23 can be controlled. C2 designates a stabilized capacitor.

Figure 10:
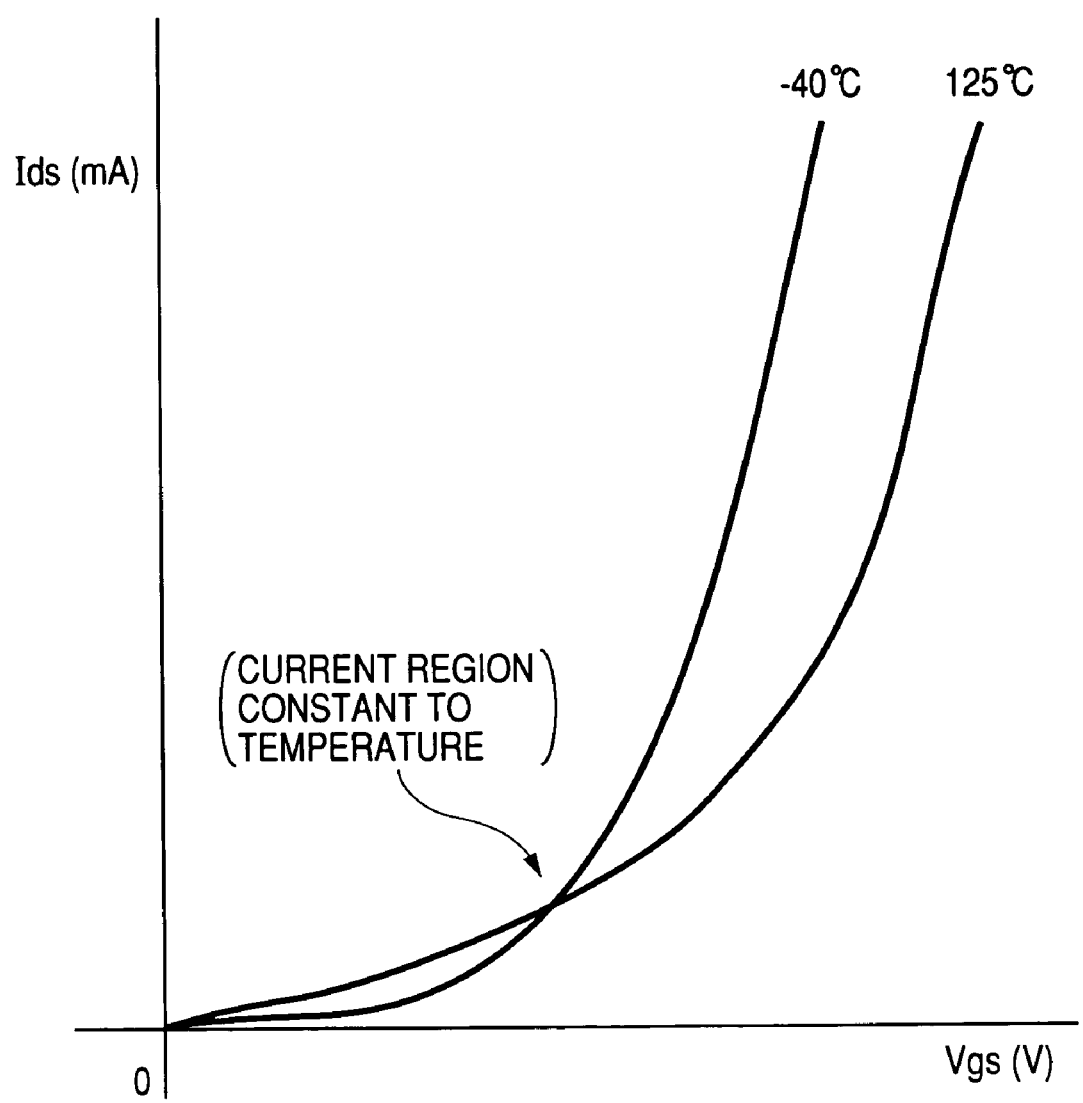
FIG. 10 is an explanatory diagram illustrating Vgs-Ids characteristics of a MOS transistor.

The bias circuit 22 forms the bias voltages VGP and VGN and is configured so as to compensate for variations in the bias voltages due to a change in temperature. That is, the bias circuit 22 configures a constant current circuit comprising a p channel type first MOS transistor M7 of which the source is supplied with the operating power supply voltage Vfdd and the gate and drain are short-circuited therebetween, an n channel type second MOS transistor M8 of which the source is supplied with the circuit's ground voltage Vss and the gate and drain are short-circuited therebetween, and a resistive element Rf having one end connected to the drain of the first MOS transistor M7 and the other end connected to the drain of the second MOS transistor M8. The bias circuit 22 outputs a drain voltage of the first MOS transistor M7 as the bias voltage VGP and outputs a drain voltage of the second MOS transistor M8 as the bias voltage VGN. As represented by Vgs-Ids characteristics of each MOS transistor, which are illustrated in FIG. 10, the MOS transistor has a region in which Ids is constant to the temperature. The value of the resistor Rf is determined such that the first MOS transistor M7 and the second MOS transistor M8 are operated in this region. Thus, the condition for a gate-to-source voltage under which a change in drain-to-source current is made small with respect to a change in temperature, is made satisfactory to the first MOS transistor M7 and the second MOS transistor M8. In short, the bias circuit 22 supplies a constant current even with respect to the change in temperature. The VCO 23 is conductance-controlled in accordance with the bias voltages VGP and VGN received at the current-limit MOS transistors M5 and M6, the VCO 23 allows a constant current to flow even with respect to the change in temperature in a manner similar to the bias circuit 22. Thus, it is possible to realize temperature compensation for the frequency of the internal clock signal VCLK.

Since the condition for the temperature compensation by the bias circuit 22 is to meet the gate-to-source voltage that satisfies such characteristics as illustrated in FIG. 10, a substantial change in operating power supply voltage Vfdd becomes adverse. In regard to this point, the configuration of FIG. 8 is greatly limited in a frequency variable range. In short, the configuration is limited to applications at a substantially constant frequency.

Figure 18:
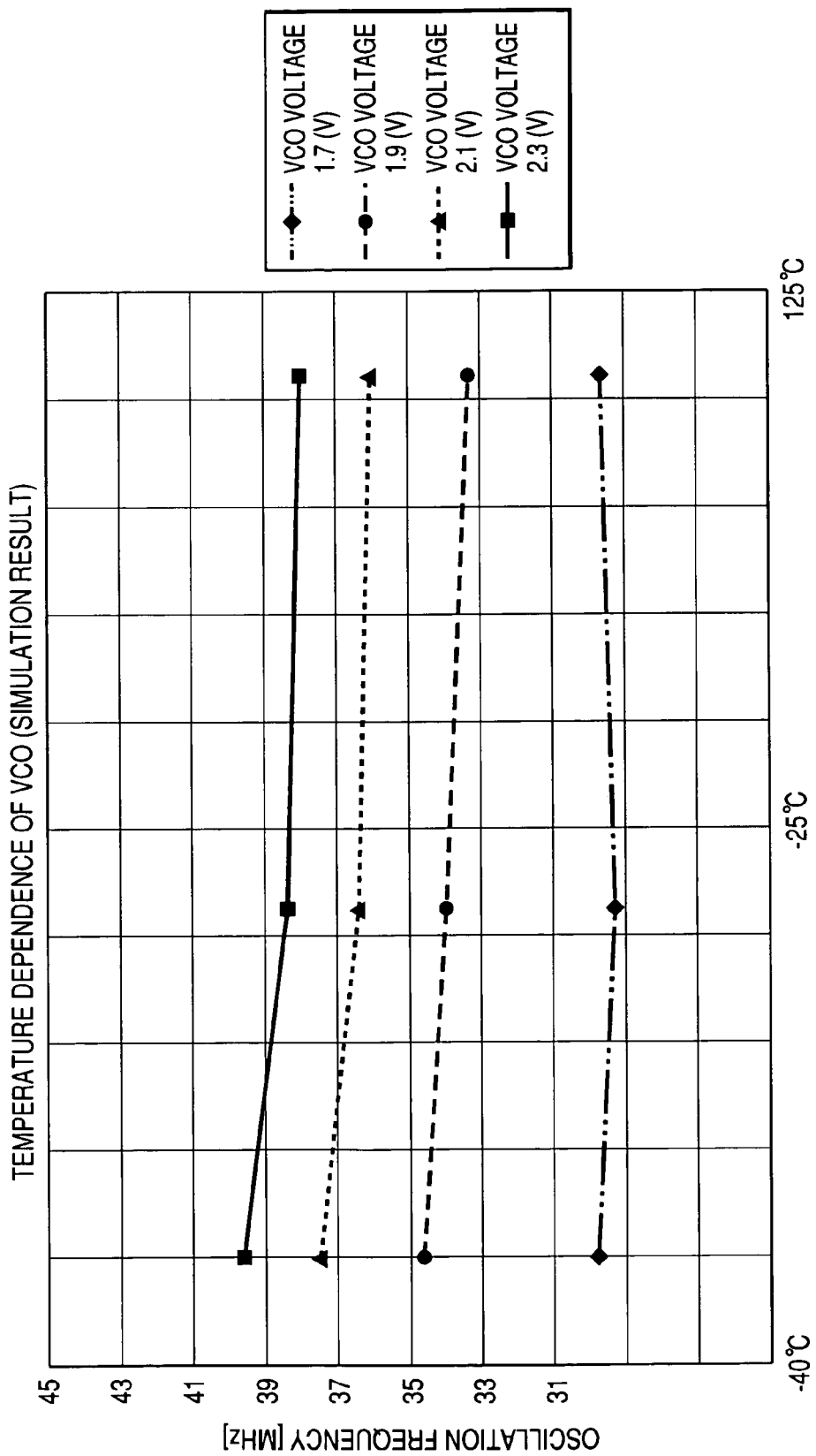
FIG. 18 is an explanatory diagram illustrating simulation results related to temperature dependence of a VCO employed under a configuration shown in FIG. 8.

Simulation results related to temperature dependence of the VCO having the configuration of FIG. 8 are illustrated in FIG. 18. FIG. 18 illustrates several examples different in VCO voltage or control voltage. The illustrated oscillation frequencies relate to the temperature dependence relaxed with respect to the corresponding control voltages. The configuration of FIG. 8 is limited to the applications at the substantially constant frequency as described above. FIG. 18 shows simulation results of four types of circuits.

In the example of FIG. 8, a level shifter (SHFT) 52 level-shifts the oscillation output of the ring oscillator section 51 from a Vfdd level to a Vcc level. A divider (DIV) 53 divides a level-shifted output into ½, which in turn is used as an internal clock signal VCLK. The divider 53 is provided in consideration of duty compensation. Further, a division ratio is made large when timing is strict, whereas when timing is not strict, then the divider 53 may be unadopted. Incidentally, the term of "the division ratio set by the divider 53 is made large" means that the oscillation frequency of the ring oscillator section 51 is made high.

Incidentally, in FIG. 8, RW1 denotes a read/write control signal with respect to a counter 31A, and RW2 denotes a read/write control signal with respect to a counter 31B. A start signal START is inputted to clear terminals (clear) of the counters 31A and 31B. The start signal START gives instructions for clearing of a count value when it is low in level and gives for count starting when it is high in level.

Figure 11:
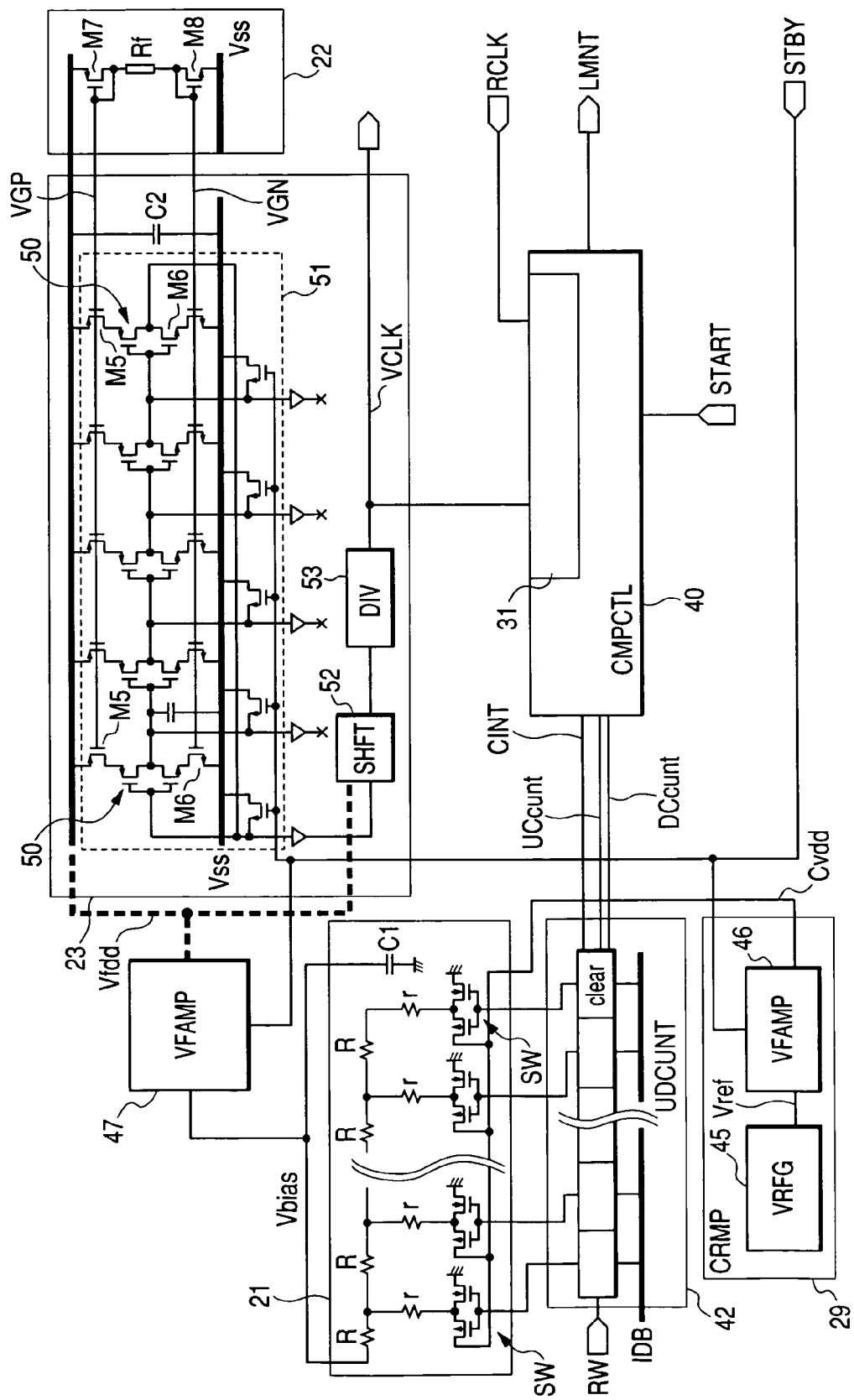
FIG. 11 is a circuit diagram illustrating a detailed circuit corresponding to the internal oscillator circuit module shown in FIG. 6.

A detailed circuit example corresponding to the internal oscillator circuit module 5 of FIG. 6 is shown in FIG. 11. The updown counter 42 can be cleared by a counter initializing signal CINT and configured such that an initial value can be preset thereto by the CPU 2 via a data bus IDB. The cleared or preset updown counter 42 is counted up or counted down in response to an up clock UCcunt or a down clock DCcunt outputted from the CMPCTL 40. The CMPCTL 40 follows instructions for a comparing operation in accordance with a start signal START. A lock monitor signal LMNT indicative of the coincidence in comparing operation is used as a frequency setting operation end signal FNCK and a write pulse with respect to a non-volatile register NVREG.

Figure 12:
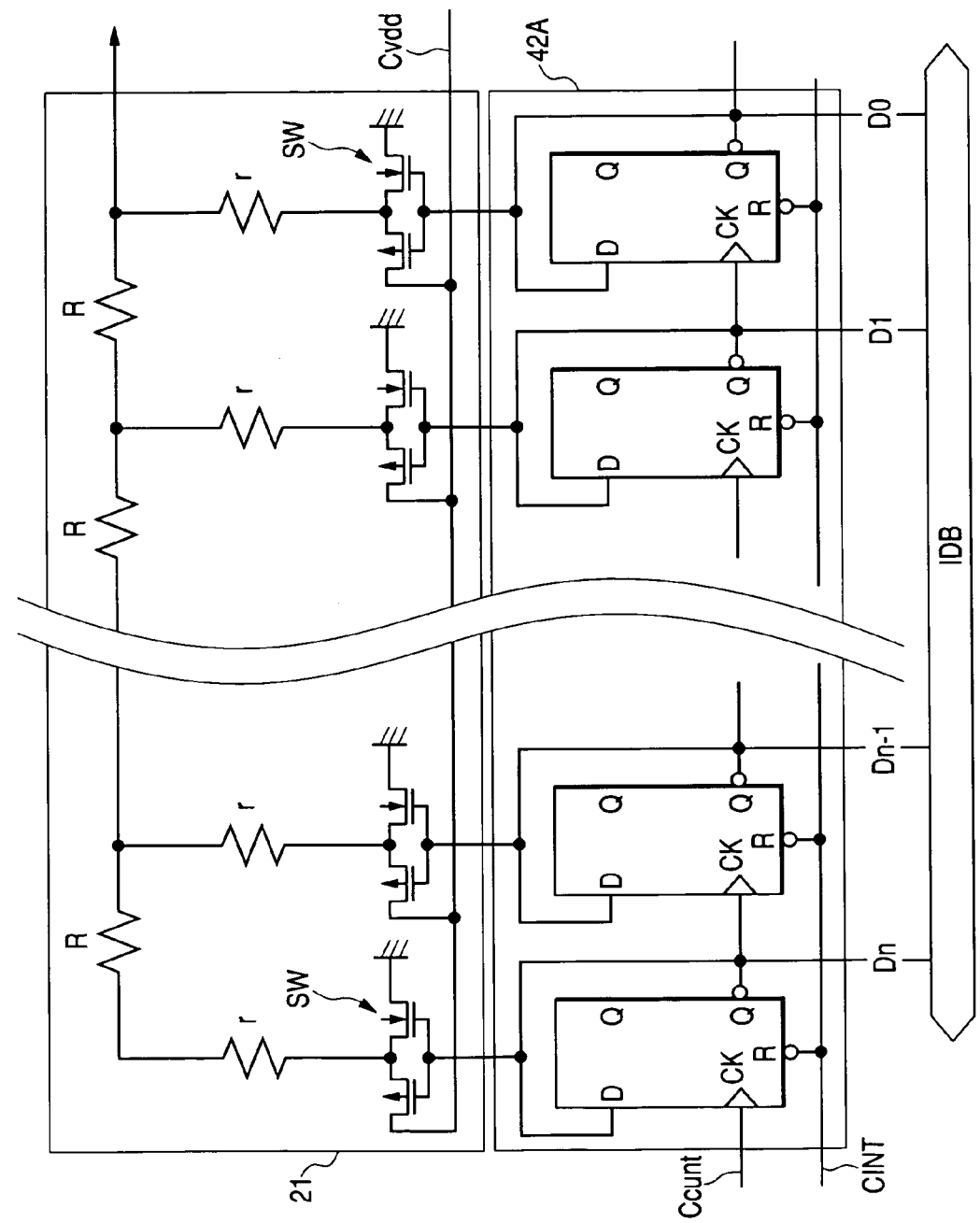
FIG. 12 is a block diagram illustrating a counter (CUNT) adoptable in place of a UDCUNT shown in FIG. 11.

A counter (CUNT) 42A adoptable in place of the UDCUNT 42 shown in FIG. 11 is illustrated in FIG. 12. A count operation of the counter 42A is intended for only upcount. A preset value initially set to the counter 42A needs to be smaller than an expected value. A count clock Ccunt is changed each time a comparison/decision as to the non-coincidence by the CMPCTL 40 is made, whereby the counter 42A is counted up.

Figure 13:
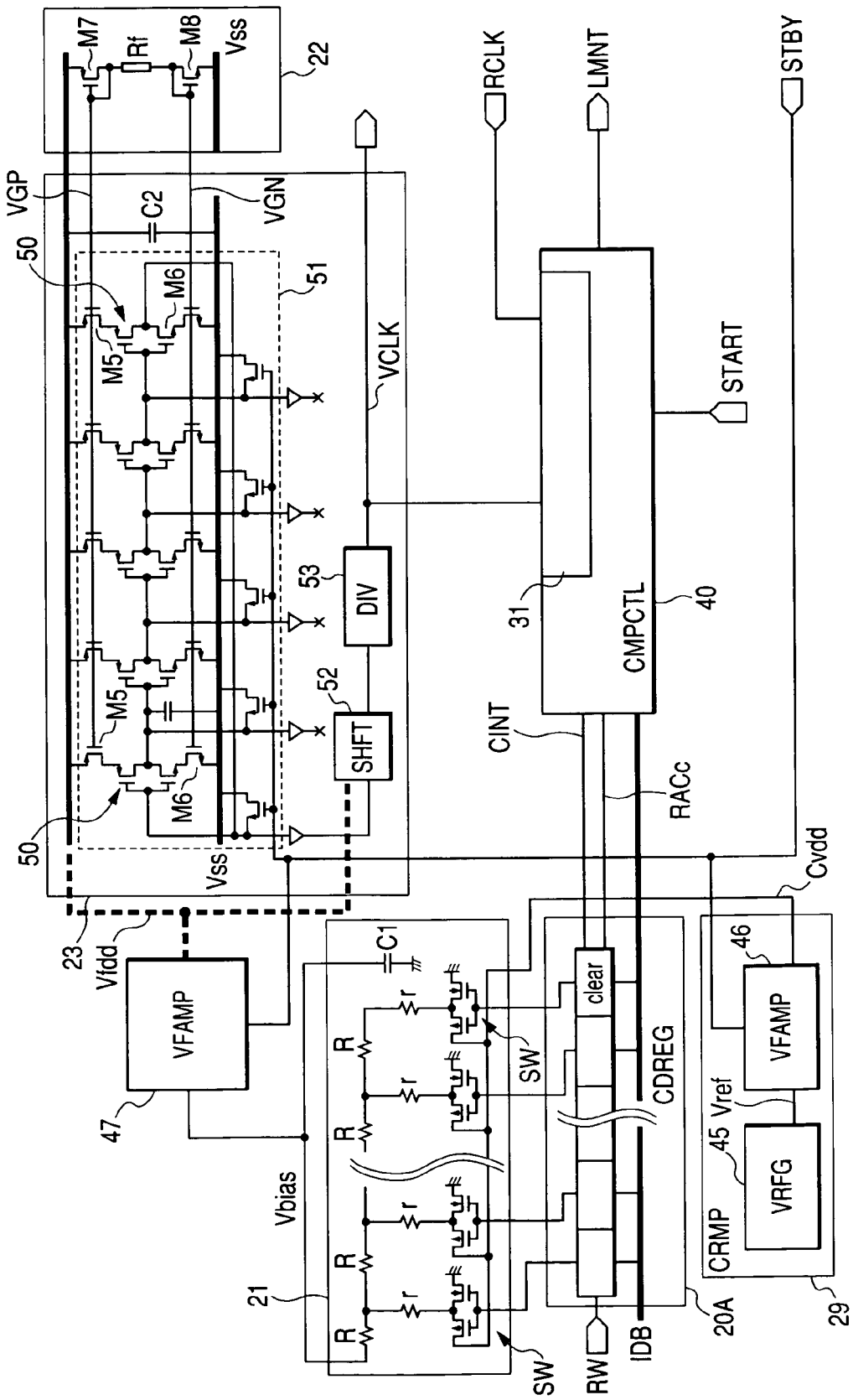
FIG. 13 is a circuit diagram showing a modification of FIG. 11.

A modification of FIG. 11 is shown in FIG. 13. The modification shown in FIG. 13 is different from FIG. 11 in that a control data register (CDREG) 20A is adopted as an alternative to the UDCUNT 42. The CDREG 20A is made accessible by the CMPCTL 40 through the internal data bus IDB. Access instructions for the CMPCTL 40 are given by a register access signal RACC. In the present configuration, the CMPCTL 40 rewrites control information into the CDREG 20A in accordance with the magnitude of the result of comparison between clock count values by the sampling circuit 31. When the difference between the clock count values is large, the absolute value of the amount of renewal of the control information is made large. The CMPCTL 40 may carry out even presetting to the CDREG 20A.

Figure 14:
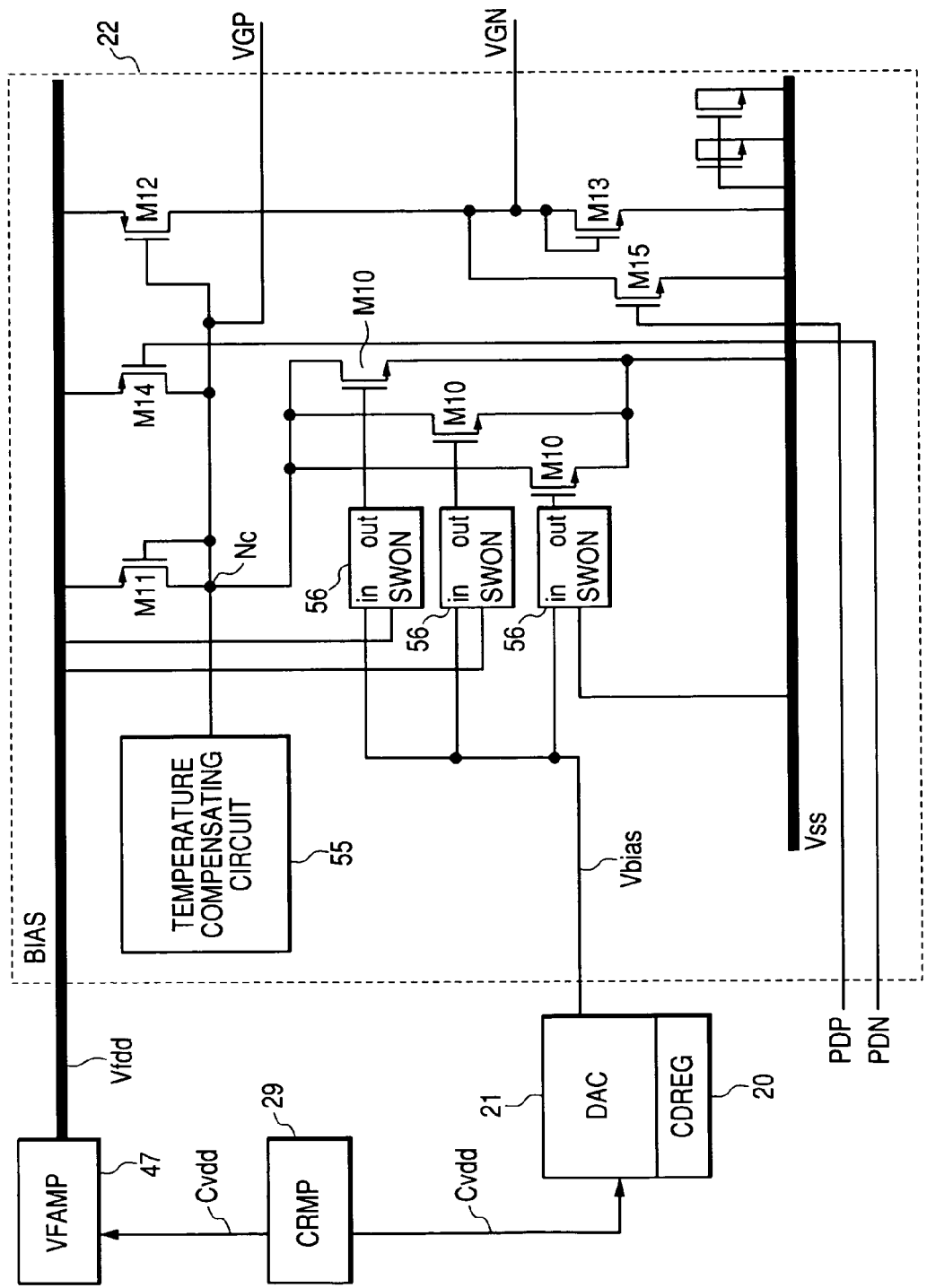
FIG. 14 is a circuit diagram showing another example of a bias circuit.

Another example of a bias circuit is shown in FIG. 14. Although the example of FIG. 8 or the like is limited to the use of the constant current region with respect to the temperature as shown in FIG. 10, FIG. 14 shows an example in which such a limitation is not provided. The bias circuit 22 includes n channel type MOS transistors M10 conductance-controlled by a bias voltage Vbias, which are arranged three in parallel. A current path extending from Vfdd to Vss via a load MOS transistor M11 whose gate and drain are connected, is formed to each MOS transistor M10. An intermediate node Nc of the current path is set to one control voltage VGP. A p channel type MOS transistor M12 which accepts the intermediate node Nc at its gate, and a load MOS transistor M13 whose gate and drain are connected, form another current path. The drain of the MOS transistor M13 is set to the other control voltage VGN. When the level of the input voltage Vbias of the bias circuit 22 becomes high, the level of the node Nc is lowered so that the conductance of the MOS transistor M12 increases. Thus, the level of the control voltage VGP is reduced and the level of the control voltage VGN is raised. As a result, the operating current of each CMOS delay stage 50 described in FIG. 8 or the like increases to make the oscillation frequency high. When the level of the input voltage Vbias of the bias circuit 22 becomes low, the level of the node Nc increases, the level of the control voltage VGP rises and the level of the control voltage VGN drops in reverse. As a result, the operating current of each CMOS delay stage 50 described in FIG. 8 or the like decreases to make the oscillation frequency low. In the example shown in FIG. 14, a temperature compensating circuit 55 is provided in terms of temperature compensation and supplies a current necessary for the temperature compensation to the node Nc. Although not shown in particular, the temperature compensating circuit 55 can be configured using a logical threshold voltage generator and an op amplifier or the like where a variation in frequency due to a variation in VLT (logical threshold voltage) of VCO, for example becomes a problem. Incidentally, reference numerals 56 designate selector switch circuits which respectively control the gate inputs of the MOS transistors M10 and are capable of selecting inputs supplied from their terminals SWON and inputs supplied from their terminals in. When the input supplied from the terminal SWON is selected, the conductance of the corresponding MOS transistor M10 is kept constant regardless of Vbias. M14 and M15 are respectively MOS transistors which fix the control voltage VGP to Vdff and fix the control voltage VGN to Vss, respectively.

<<Temperature Dependence Compensation by Paying Attention to VLT>>

Figure 19:
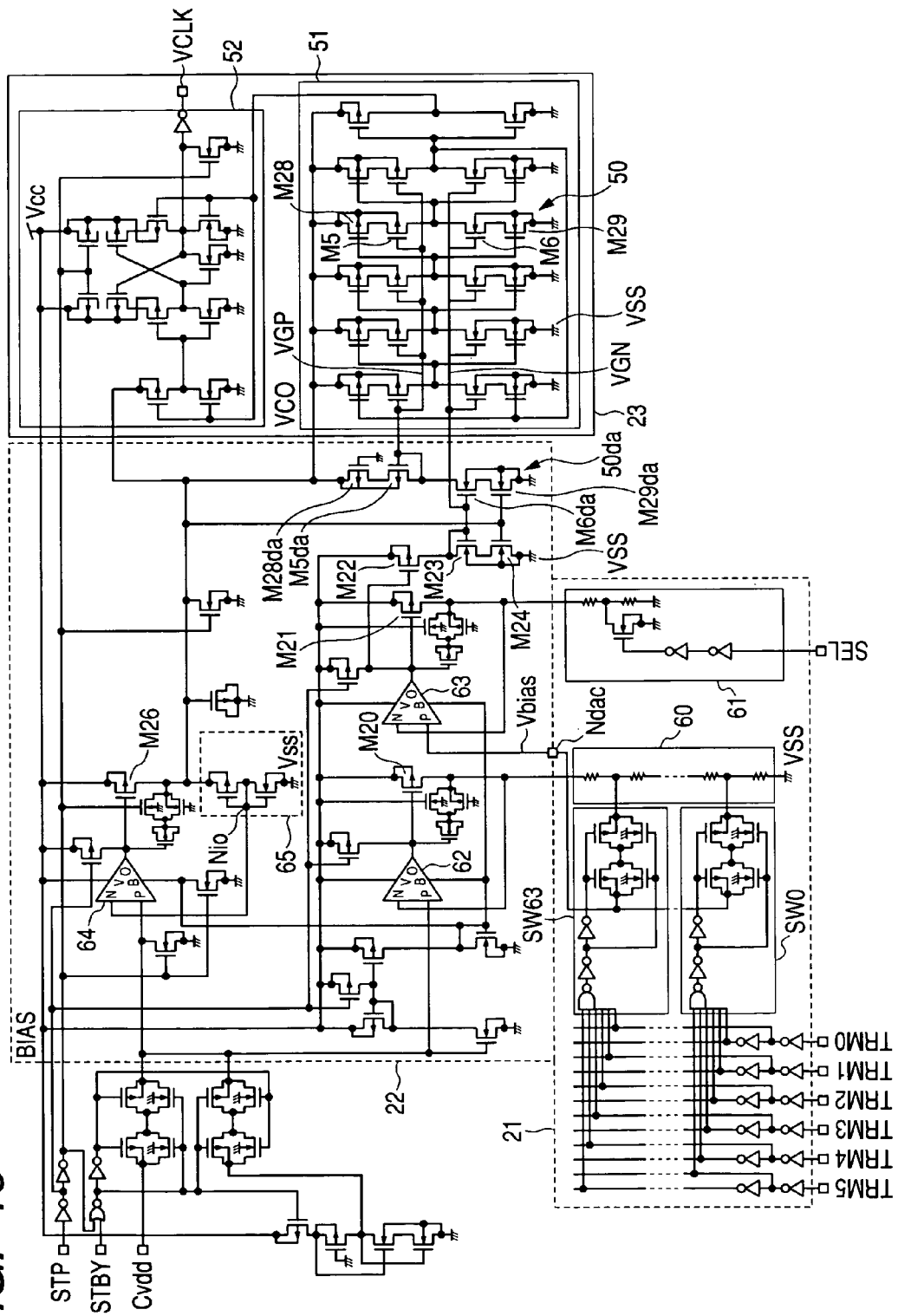
FIG. 19 is a circuit diagram showing a circuit example of an internal oscillator circuit module which performs temperature compensation by paying attention to VLT.

A circuit example of an internal oscillator circuit module 5 which performs temperature compensation by paying attention to VLT is shown in FIG. 19. Another circuit example of a BIAS 5 will principally be explained in detail here. In the present example, another circuit configuration is adopted even for a DAC 21. Switch circuits SW0 through SW63 respectively select division taps of a series resistance circuit 60 in accordance with the values of control information TRM0 through TRM5. Thus, an analog voltage is obtained at a node Ndac. A circuit designated at reference numeral 61 is a circuit which generates a current corresponding to the analog voltage of the node Ndac and is capable of performing switching to its current value in accordance with a signal SEL.

Figure 20:
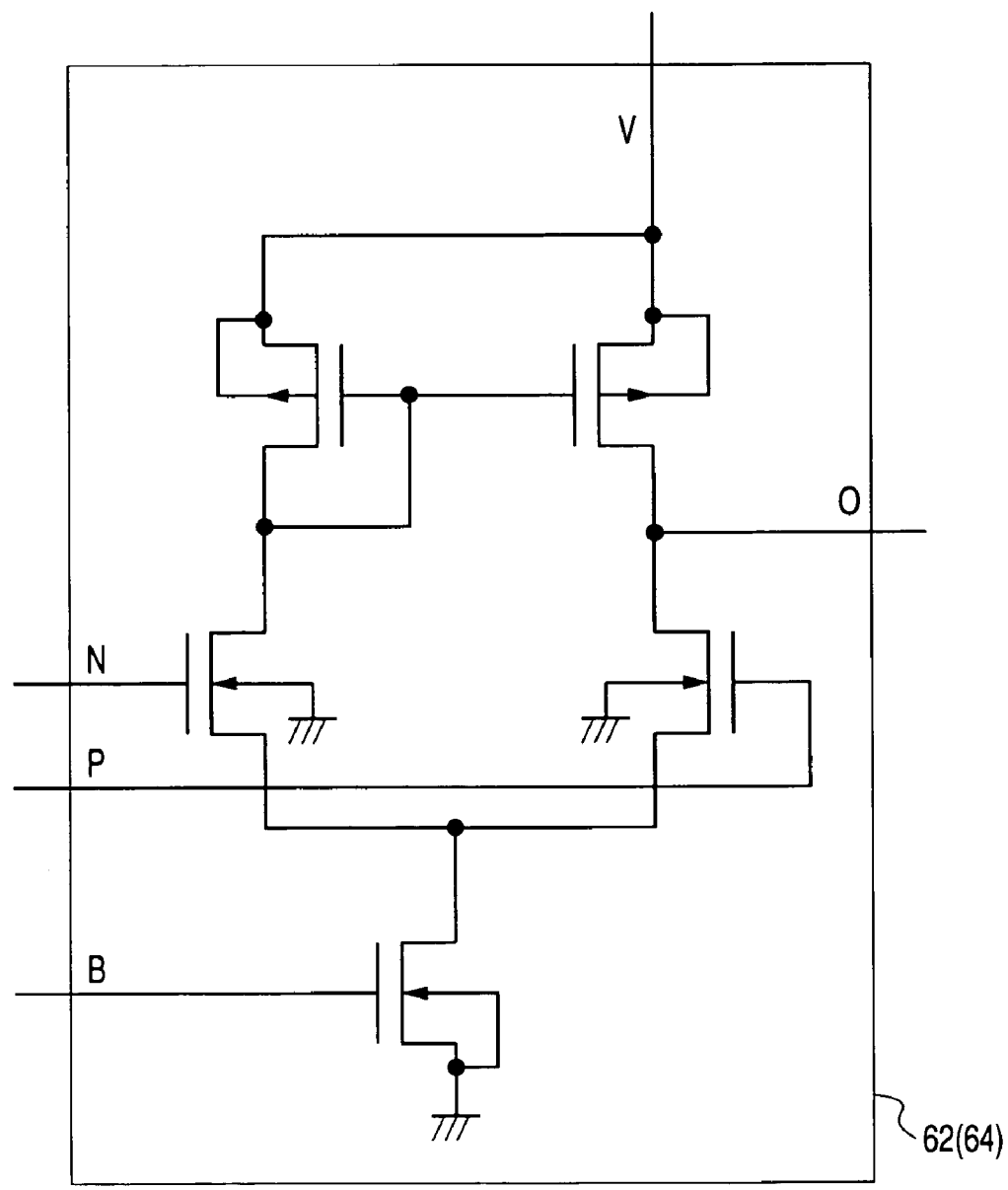
FIG. 20 is a circuit diagram illustrating op amplifiers 62 and 64 shown in FIG. 19.
Figure 21:
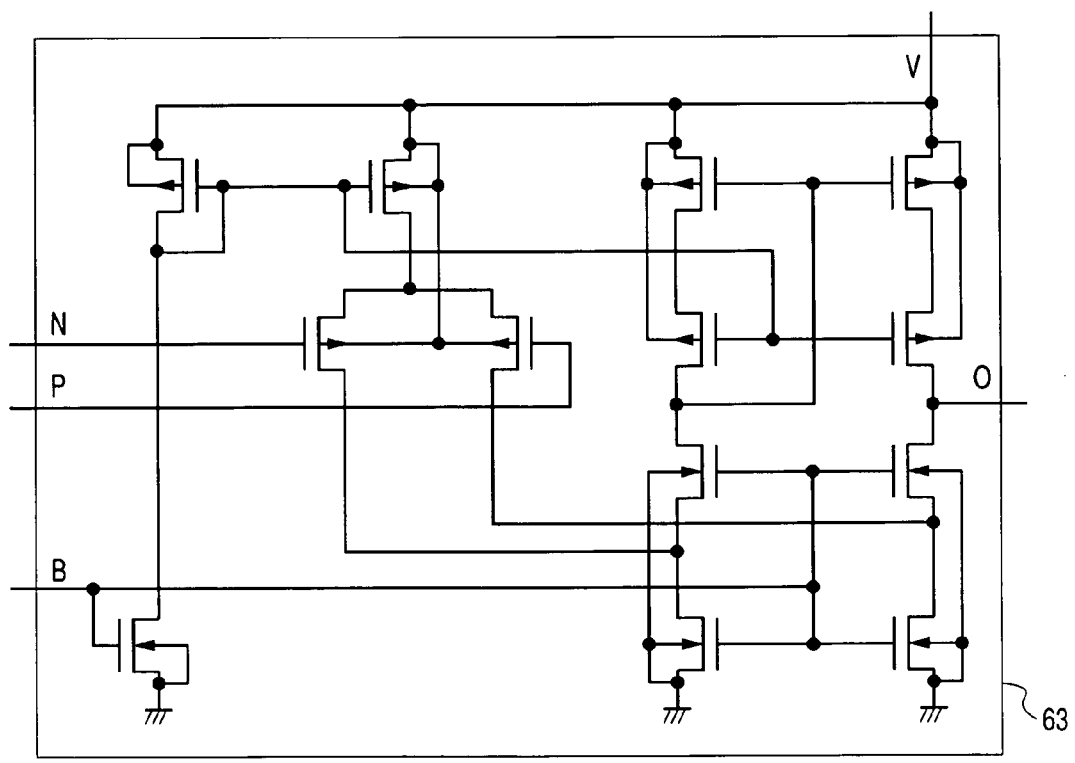
FIG. 21 is a circuit diagram illustrating an op amplifier 63 shown in FIG. 19.

A bias circuit 22 includes three op amplifiers 62 through 64. Each of the op amplifiers 62 and 64 has a circuit configuration illustrated in FIG. 20. The op amplifier 63 has a circuit configuration illustrated in FIG. 21. A p channel type MOS transistor M20 whose conductance is controlled by the output of the op amplifier 62, and the series resistance circuit 60 form a current path between a power supply voltage Vcc and a circuit's ground voltage Vss. The op amplifier 62 has an inversion input terminal N to which a division voltage set by the series resistance circuit 60 is fed back, and a non-inversion input terminal to which an output voltage Cvdd of a clamp circuit 29 is supplied. Thus, the op amplifier 62 controls the conductance of the MOS transistor M20 in accordance with an output voltage corresponding to a voltage equivalent to the difference between the two voltages. In short, the operating voltage of the series resistance circuit 60, which corresponds to a conversion reference voltage of the DAC 21, is set to the clamp voltage Cvdd. The op amplifier 63 controls the conductance of the MOS transistor M21 in such a manner that the voltage equal to the analog conversion voltage Vbias of the node Ndac is formed at the drain of the MOS transistor M21. Thus, the current that flows through the MOS transistor M21 is determined by the analog conversion voltage Vbias and the resistances in the circuit 61 and has a constant current characteristic constant to the power supply voltage Vcc. Also the current is transferred to a MOS transistor M22 in a predetermined mirror ratio. The MOS transistor M22 forms a current path together with n channel type MOS transistors M23 and M24 connected in series between Vcc and Vss. A drain voltage of the MOS transistor M22 is supplied to a VCO 23 as one control voltage VGN.

The bias circuit 22 has a logical threshold voltage simulation circuit 65. The logical threshold voltage simulation circuit 65 has a circuit configuration wherein the input and output of each CMOS inverter are short-circuited, and forms a logical threshold voltage (VLT) relative to its operating power supply voltage at a short-circuit input/output terminal Nio. The logical threshold voltage simulation circuit 65 forms a current path together with a p channel type MOS transistor M26 connected in series between Vcc and Vss. The op amplifier 64 includes an inversion input terminal (N) to which the node Nio of the logical threshold voltage simulation circuit 65 is feedback connected, and a non-inversion input terminal (P) to which the output voltage Cvdd of the clamp circuit 29 is supplied. The op amplifier negative feedback controls the conductance of the MOS transistor M26 in accordance with a voltage equal to the difference between the voltage at the node Nio and the output voltage Cvdd. A voltage determined by Cvdd and VLT is formed at the drain of the MOS transistor M26. For example, a voltage like 2×Cvdd is formed at the drain thereof. This voltage is set as an operating power supply voltage of the VCO 23.

The bias circuit 22 has a dummy circuit 50da for CMOS delay stages 50. Here, the CMOS delay stage 50 includes current-limit MOS transistors M5 and M6 arranged in a central portion, and a p channel type MOS transistor M28 and an n channel type MOS transistor M29 constituting a CMOS inverter, both of which are disposed thereoutsinde. The dummy circuit 50da comprises MOS transistors M28da, M5da, M6da and M29da. The gate of the MOS transistor M29da is supplied with the drain voltage of the MOS transistor M26, the gate of the MOS transistor M28da is supplied with Vss, and the gate of the MOS transistor M6da is supplied with the one control voltage VGN, whereby the voltage between the common gate and drain terminals of the MOS transistor M5da is set as the other control voltage VGP to enable mirror reflection of a current flowing through the MOS transistor M5da on each CMOS delay stage 50 of the VCO 23.

The current that flows through the MOS transistors M5da and M6da is a mirror current corresponding to a constant current that flows through the MOS transistor M21. Thus, the drain currents of the current-limit MOS transistors M5 and M6 in the respective CMOS delay stages 50 lying within the VCO 23 that receives the control voltages VGN and VGP therein also have constant current characteristics. The gate capacitance of the CMOS inverter comprising the MOS transistors M28 and M29 in the next-stage CMOS delay stage 50 is charge/discharge-driven by the constant current. Its charge/discharge time constant becomes a delay element. The constant current is generated by the D/A-converted voltage Vbias formed with the clamp voltage Cvdd as the reference and the resistance. Since the operating power supply voltage of the VCO 23 also corresponds to the voltage formed with Cvdd as the reference, compensation for process variations and compensation for a variation in power supply can be realized. Further, such a voltage that the logical threshold voltage VLT of the logical threshold voltage simulation circuit 65 becomes equal to Cvdd, is outputted from the MOS transistor M26 by the logical threshold voltage simulation circuit 65. Since this voltage is given as the operating power supply voltage for the VCO 23, the logical threshold voltage of the CMOS inverter comprising the MOS transistors M28 and M29 in each CMOS delay stage 50 can be always controlled constant. Further, it is possible to compensate for variations in the oscillation frequency of the ring oscillator section even with respect to a change in temperature.

When the logical threshold voltage of the CMOS inverter will rise with a rise in temperature, for example, the drain voltage of the MOS transistor M26, i.e., the operating power supply voltage of the VCO 23 is lowered so that a variation in the logical threshold voltage of the CMOS inverter is suppressed. The term of "the logical threshold voltage of the CMOS inverter rises with the rise in temperature" means that the current drive capacity of the p channel type MOS transistor with respect to the n channel type MOS transistor is relatively improved. Lowering the power supply voltage and controlling the logical threshold voltage constant results in the fact that a source-to-gate voltage VGS at the time that the p channel type MOS transistor starts to operate is controlled in the direction to be narrowed, thus suppressing an improvement in current drive capacity.

Although the output delay of the CMOS delay stage 50 is made with the time for charge/discharge of the next-stage gate capacity by the constant current flowing through each of the current-limit MOS transistors M5 and M6 as the main element as mentioned above, the characteristics of the MOS transistors M28 and M29 constituting the CMOS inverter are also intervened immediately after the start of inversion of the outputs of the respective CMOS delay stages 50. When the output of the CMOS delay stage 50 starts to rise from 0V, for example, the MOS transistor M28 makes transition from an OFF state to an ON state but the output current characteristic of the MOS transistor M28 exerts an influence on a rise in output voltage during its transition. The MOS transistor M29 at the time that the output is lowered is also similar to the above. Thus, the influence of the MOS transistors M28 and M29 on the delay characteristic of each CMOS delay stage 50 can be held constant by controlling the logical threshold voltage of the CMOS inverter constant as described above. Thus, since the control voltages VGN and VGP and the operating power supply voltage of the VCO 23 are set to the voltages that correlate with the D/A-converted voltage Vbias and the logical threshold voltage VLT, compensation for process variations and compensation for a variation in power supply are realized as described above. Further, since the logical threshold voltage simulation circuit 65 supplies the current in the direction to cancel out a change in current due to a variation in the logical threshold voltage of the CMOS circuit to the ring oscillator section, it may be feasible to compensate for variations in the oscillation frequency of the ring oscillator section due to a change in temperature.

Incidentally, the illustration of the divider is omitted in FIG. 19.

Figure 22:
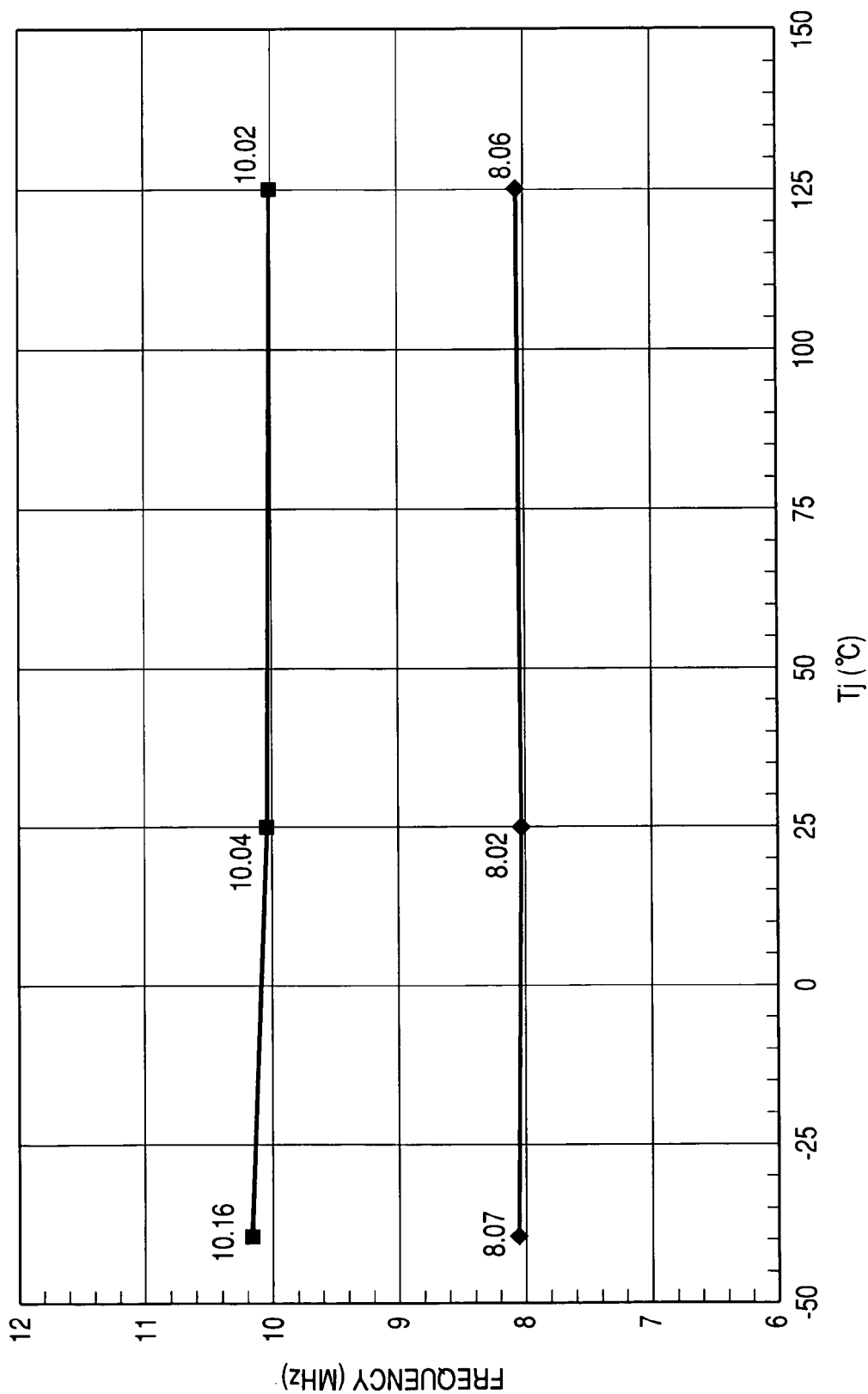
FIG. 22 is an explanatory diagram illustrating simulation results related to temperature dependence of a VCO employed under a configuration shown in FIG. 19.

Simulation results related to temperature dependence of the VCO employed under the configuration shown in FIG. 19 is illustrated in FIG. 22. The temperature dependence is relaxed at each oscillation frequency illustrated herein.

<<Frequency Setting Process>>

Figure 23:
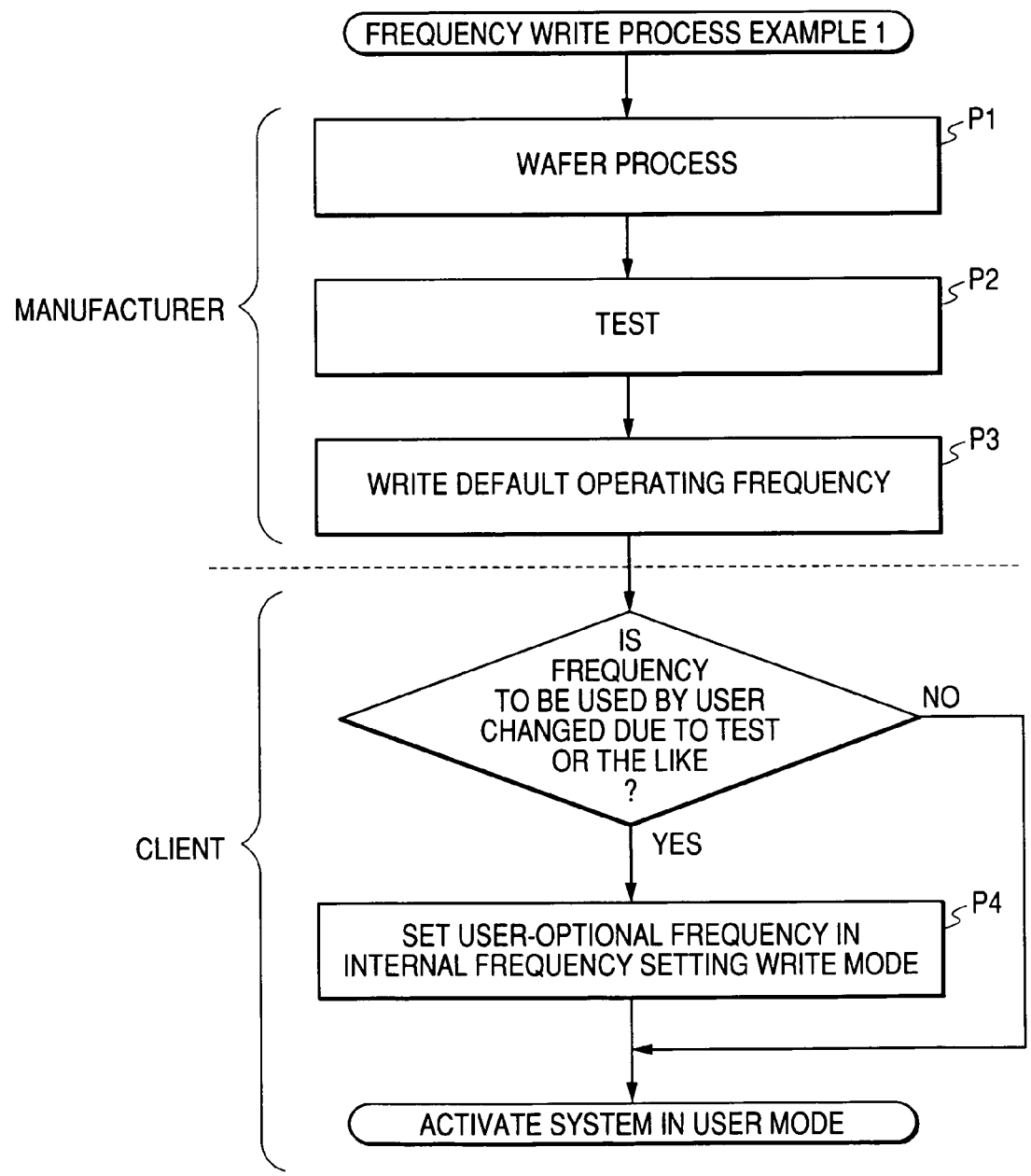
FIG. 23 is a flowchart illustrating a frequency setting process employed in a process for manufacturing a microcomputer, particularly, a general-purpose microcomputer.

A frequency setting process employed in a process for manufacturing the microcomputer 1 is illustrated in FIG. 23. In the drawing, the microcomputer 1 is supposed to be a general-purpose microcomputer. That is, the present microcomputer 1 is intended for a microcomputer which adopts an internal oscillator circuit module in which the settable frequencies are not restrictive as illustrated in FIG. 19.

A manufacturer conducts a wafer process (P1) and a test (P2). Thereafter, control information for determining a default operating frequency in accordance with each customer specs is written into the predetermined region 6cd of the non-volatile memory 6 (P3). Incidentally, the test is done using an external clock signal without using internal oscillations upon the test (P2). Alternatively, the matching-up of the internal oscillation frequency is first done by a tester and thereafter the test may be done while the internal oscillation frequency is being changed. When the frequency to be utilized by a user is changed with respect to a default setting frequency due to the test or the like after shipment of the microcomputer, the control information in the predetermined area 6cd is rewritten using the obtained new control information (P4). Thereafter, the system can be operated at the set internal oscillation frequency in the normal mode (user mode).

Figure 24:
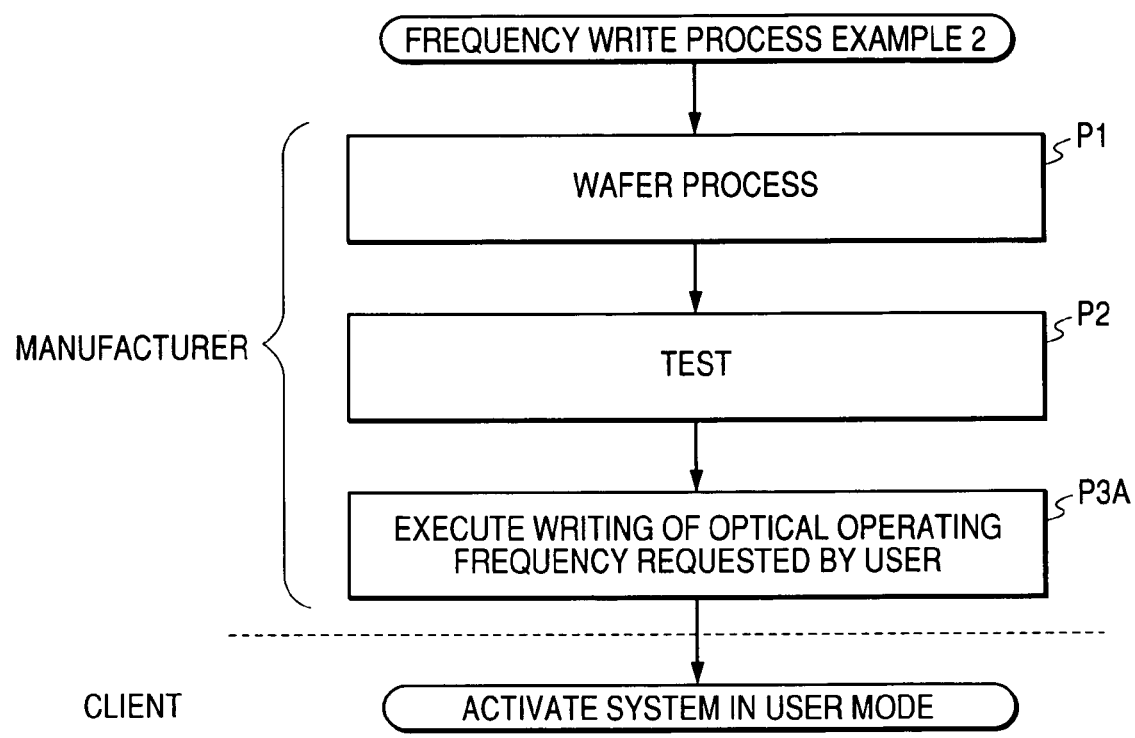
FIG. 24 is a flowchart illustrating a frequency setting process employed in a process for manufacturing a microcomputer, particularly, a custom LSI.

Another example of a frequency setting process employed in a process for manufacturing a microcomputer 1 is shown in FIG. 24. A custom LSI is assumed here. That is, as illustrated in FIG. 8, the present microcomputer 1 may be a microcomputer which adopts an internal oscillator circuit module in which a settable frequency is restrictive.

A manufacturer executes a wafer process (P1) and a test (P2). Thereafter, control information for determining an arbitrary operating frequency demanded from a customer is written into the predetermined area 6cd of the non-volatile memory 6 (P3A). After the shipment of the microcomputer, the system can be operated at an internal oscillation frequency set in the normal mode (user mode). There is no need to consider a change in frequency after its shipment.

<<Dynamic Adjustment to Clock Signal Frequency>>

Figure 25:
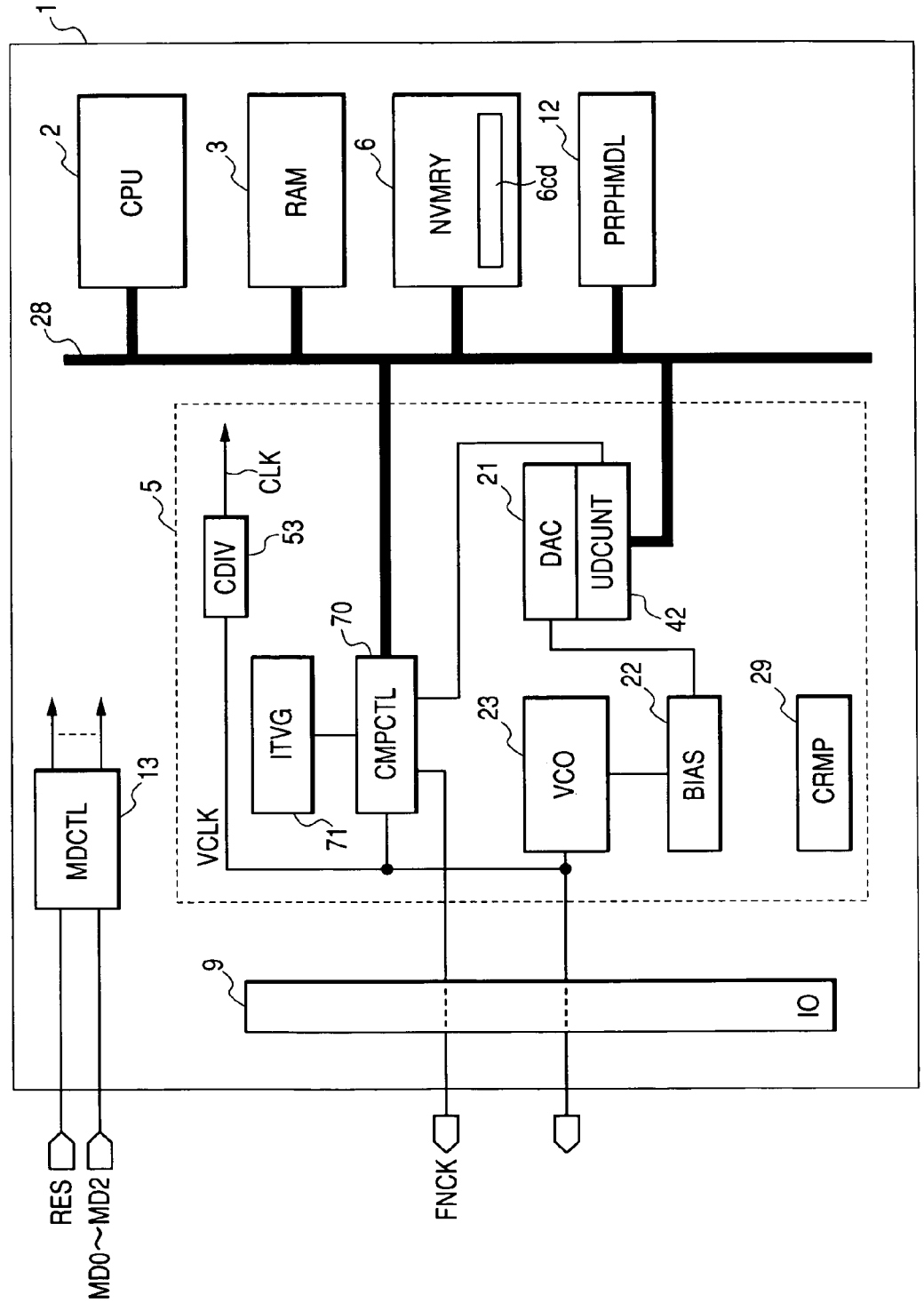
FIG. 25 is a block diagram illustrating a microcomputer equipped with an internal oscillator circuit module which sequentially and dynamically adjusts an internal oscillation clock frequency.

A microcomputer 1 equipped with an internal oscillator circuit module which sequentially and dynamically adjusts an internal oscillation clock frequency is shown in FIG. 25. The internal oscillator circuit module 5 shown in the drawing is provided with an interval generator (ITVG) 71 which periodically generates a constant section or interval of a pulse without requiring an external clock signal RCLK for the purpose of frequency setting. The internal oscillator circuit module 5 adopts a comparison controller (CMPCTL) 70 which counts the internal clock signal VCLK for each periodically generated constant interval of pulse and sequentially updates control information in the direction to allow the count value to coincide with an expected value. Here, an updown counter (UDCUNT) 42 presettable by a CPU 2 is used as a memory circuit which stores control information therein. The comparison controller 70 controls upcount and downcount of the updown counter (UDCUNT) 42.

Figure 26:
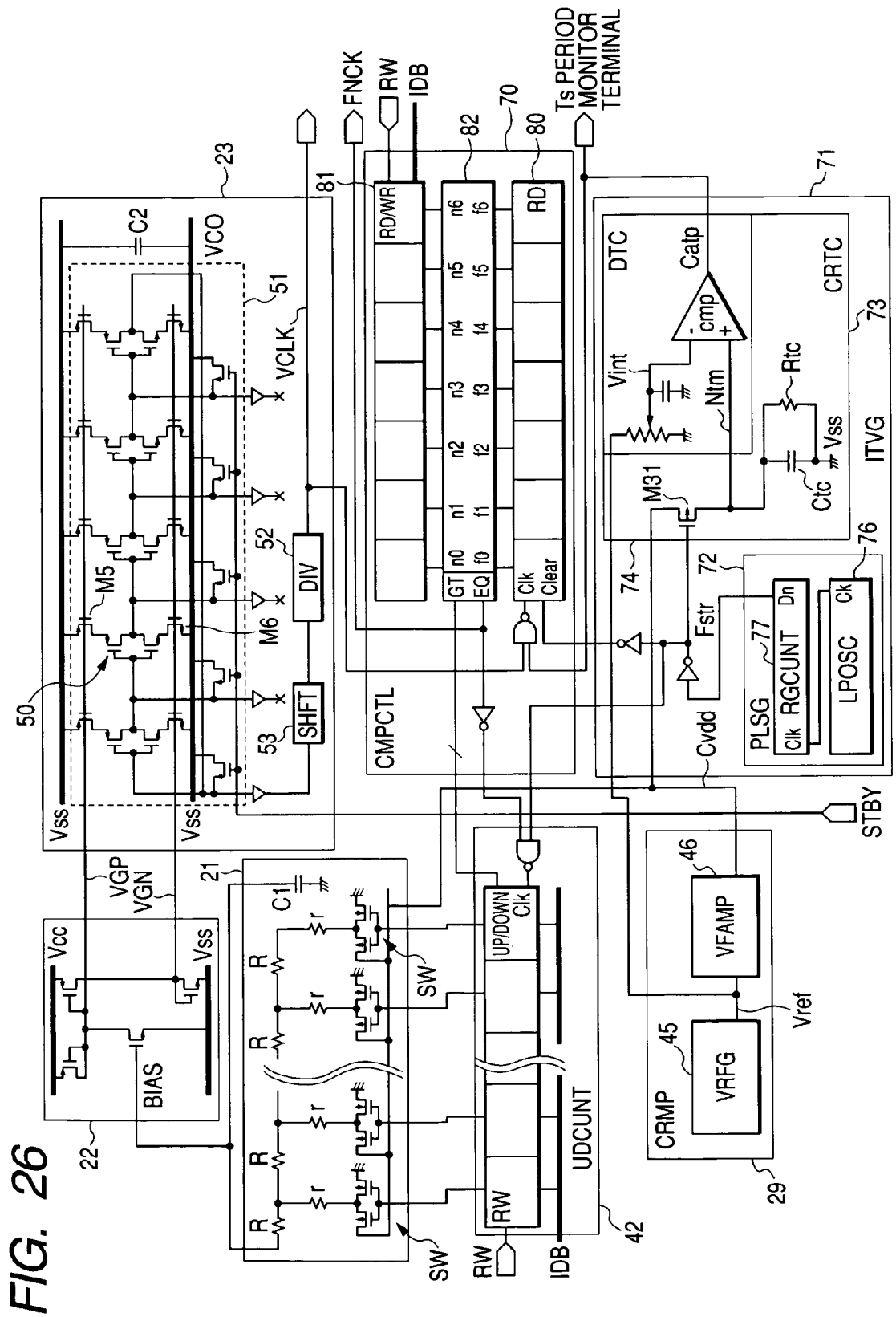
FIG. 26 is a circuit diagram illustrating a detained circuit corresponding to the internal oscillator circuit module shown in FIG. 25.

A detailed circuit example of the internal oscillator circuit module 5 of FIG. 25 is shown in FIG. 26. The interval generator (ITVG) 71 includes a pulse generator (PLSG) 72, a CR time constant circuit (CRTC) 73 which performs either a charge operation or a discharge operation from a predetermined phase point of a pulse generated from the pulse generator 72, and a detector (DTC) 74 that detects that the voltage obtained by the CR time constant circuit 73 reaches a stipulated voltage.

The pulse generator 72 comprises a low precision internal oscillator (LPOSC) 76 and a ring counter (RGCUNT) 77 which counts a clock signal outputted from the low precision internal oscillator 76. The most significant bit Dn of the ring counter 77 outputs a countup pulse Fstr. The countup pulse Fstr is brought to a low level till its countup and is brought to a high level for each countup.

The CR time constant circuit 73 has a parallel circuit of a resistor Rtc and a capacitor Ctc and is connected to a clamp voltage Cvdd via a p channel type MOS switch M31. The MOS switch M31 is brought to an on state in response to the high level of the countup pulse Fstr so that the capacitor Ctc is charged. The MOS switch M31 is brought to an off state in response to the low level of the countup pulse Fstr so that the capacitor Ctc is discharged. A charge/discharge voltage obtained by the time constant circuit 73 is illustrated as Ntm. The time constant that defines a charge/discharge time interval is determined by trimming the value of the resistor Rtc. A voltage trimming method is not limited in particular but is to be done by an aluminum master slice or a fuse program. Incidentally, the resistance value of the resistor Rtc is set to a size taken as much as the on-resistance of the MOS switch M31 is invisible. In short, the former has such a large resistance value as being capable of ignoring the latter.

The detector 74 compares the charge/discharge voltage Ntm with a decision level Vint obtained by resistance-dividing the reference voltage Vref. Cstp denotes a signal indicative of the result of comparison by the detector 74.

Figure 27:
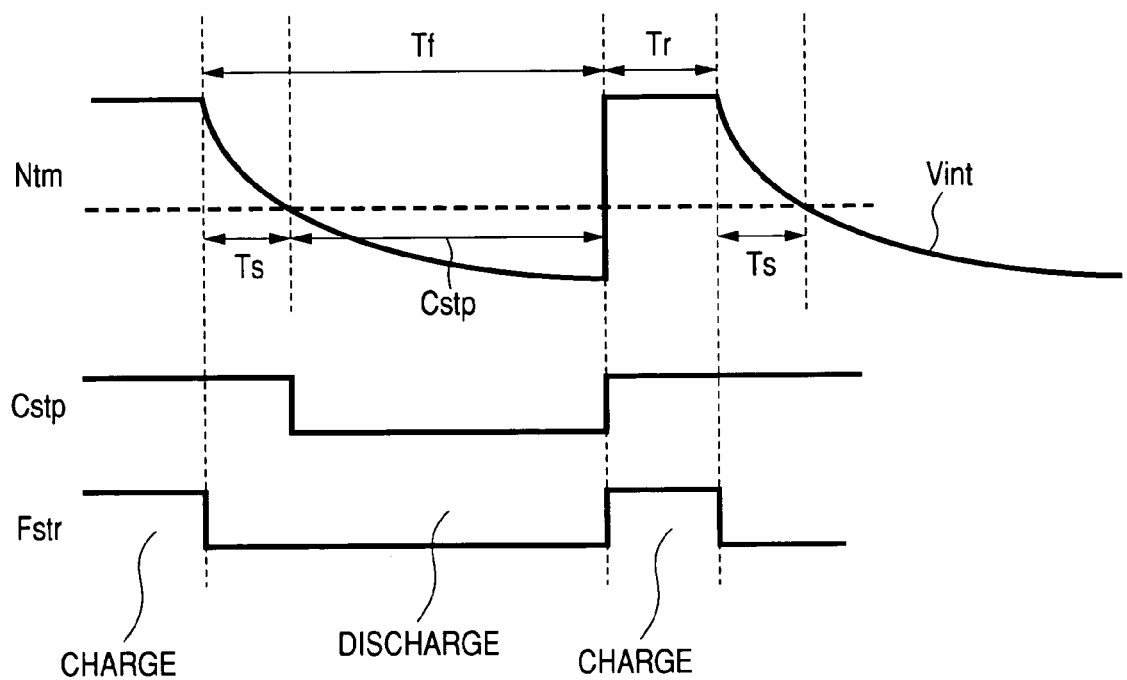
FIG. 27 is a timing chart illustrating a constant interval (Ts) generated by a charge/discharge operation of a time constant circuit shown in FIG. 26.

The voltage to be charged by the CRTC 73 is prescribed by the clamp voltage Cvdd and made stable toward a variation in temperature and a variation in the power supply voltage Vcc. The time constant prescribed by the resistor Rtc and the capacitor Ctc does not depend on the variations in the temperature and power supply voltage Vcc either. Also the decision level Vint does not depend on the variations in the temperature and power supply voltage Vcc either. Thus, as shown in FIG. 27, the time Ts necessary for the voltage Ntm to reach from the commencement of discharge of the time constant circuit to the decision level Vint becomes constant. The time from the falling edge of the countup pulse Fstr to the output of the coincidence by the detector (falling edge of Cstp) becomes a constant interval. The time Ts is set to, for example, a time interval like 100 ms.

The CMPCTL 70 has a clock counter 80 supplied with the internal clock signal VCLK. The clock counter 80 is cleared with the fall timing of the signal Fstr. Thereafter, the clock counter 80 counts the internal clock signal VCLK till the falling edge of the signal Cstp. The period required to count it is set to a period constant to the time Ts. Further, the period is set to a constant period or interval that does not depend on the variations in the temperature and power supply voltage Vcc. A count value counted during the time interval Ts is compared with a preset value of a frequency setting register 81 by a comparator 82. The comparator 82 is used as a magnitude comparator and counts up or counts down the UDCUNT 42 according to the magnitude of the result of comparison with the signal Fstr as a count clock. For each cycle of the signal Fstr, the control information is incremented by +1 or −1 or held as a pre-value. Thus, the oscillation frequency of the oscillator 23 can be dynamically adjusted for each cycle of the pulse Fstr with the constant interval Ts of the pulse as the reference in such a way as to coincide with a target frequency and not to be affected by the variations in the temperature and power supply voltage Vcc.

Figure 28:
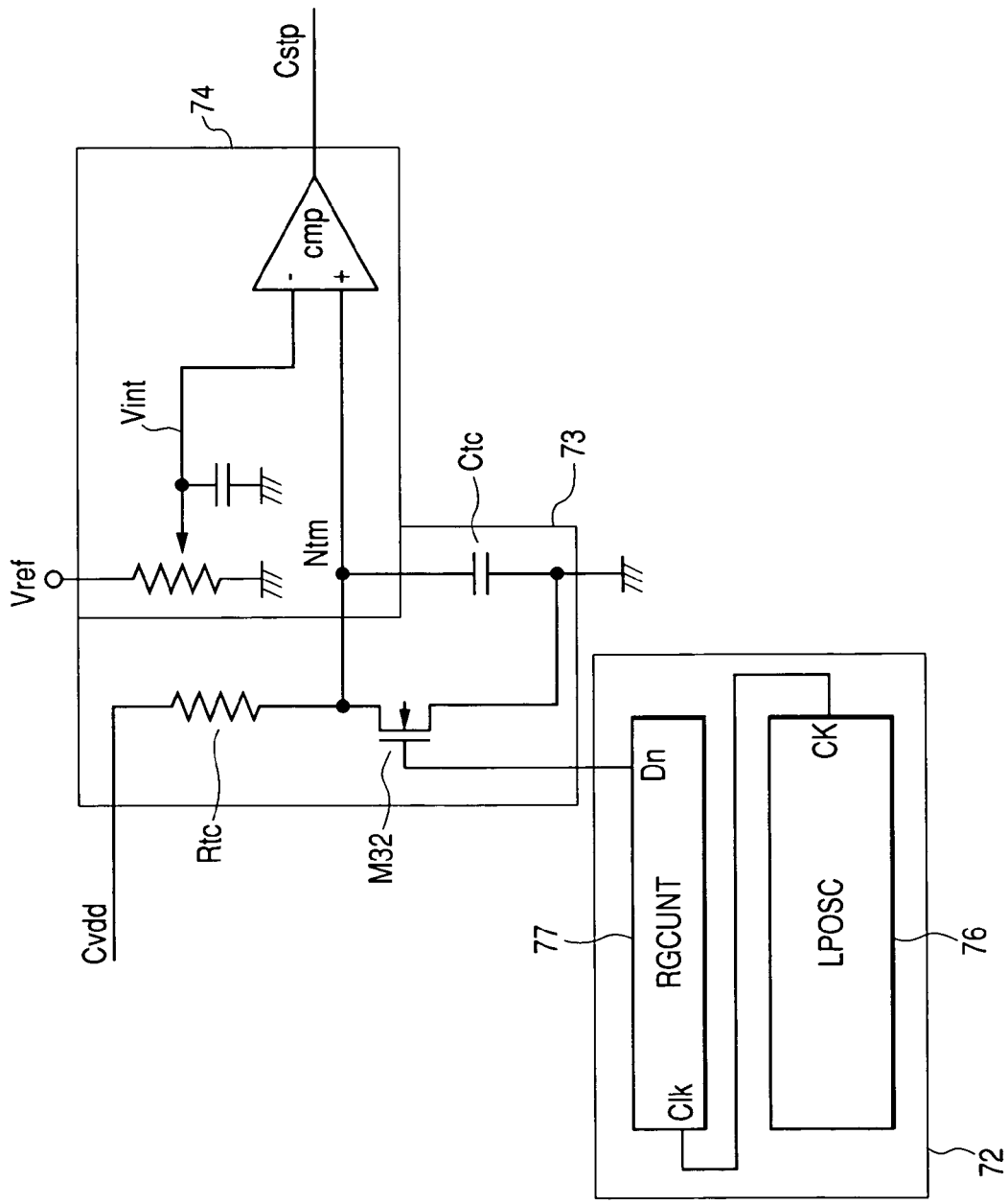
FIG. 28 is a circuit diagram showing another example of an interval generator 71.

Another example of an interval generator (ITVG) 71 is shown in FIG. 28. A CR time constant circuit 73 has a series circuit of a resistor Rtc and a capacitor Ctc. The resistor Rtc is connected to a clamp voltage Cvdd, and an n channel type MOS switch M32 is connected in parallel with the capacitor Ctc. The MOS switch M32 is brought to an on state in response to a high level of a countup pulse Fstr, so that the capacitor Ctc is discharged. The MOS switch M32 is brought to an off state in accordance with a low level of the countup pulse Fstr so that the capacitor Ctc is charged. A charge/discharge voltage obtained by the time constant circuit 73 is illustrated as Ntm. The time constant that prescribes a charge/discharge time interval is determined by trimming the value of the resistor Rtc. The present example is identical in other configuration to that shown in FIG. 26.

Figure 29:
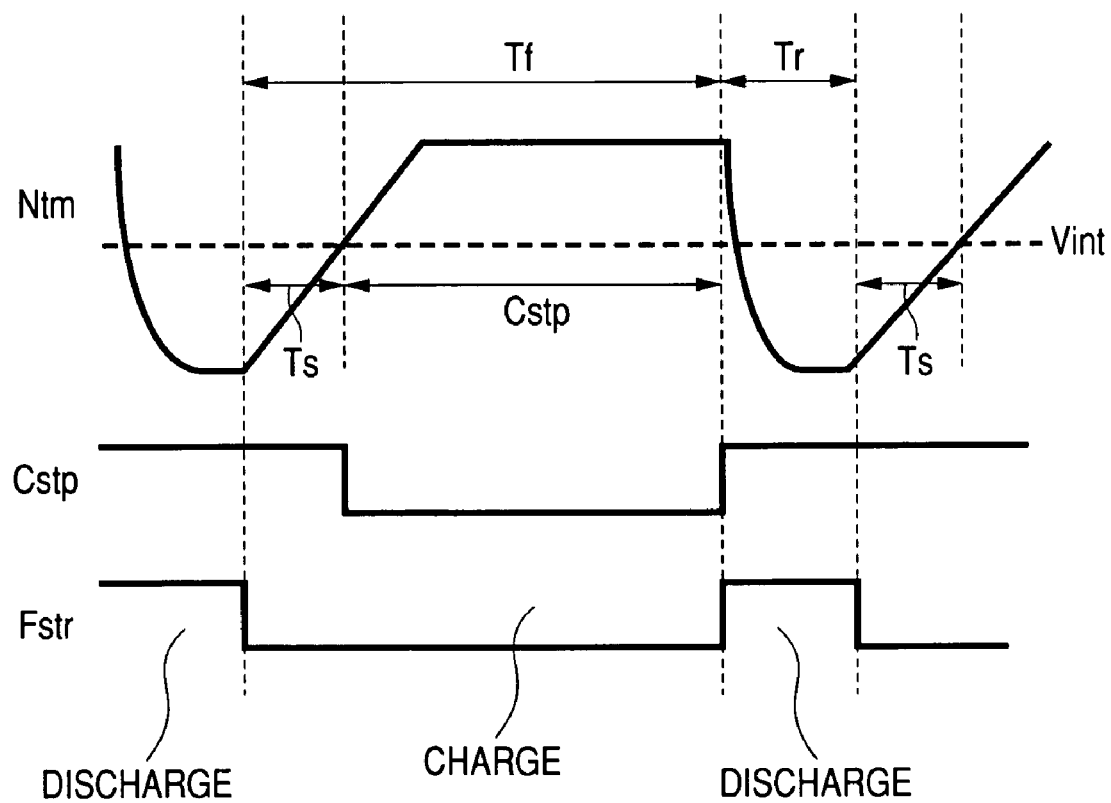
FIG. 29 is a timing chart illustrating a constant interval (Ts) generated by a charge/discharge operation of a time constant circuit shown in FIG. 28.

The charge voltage obtained by the CRTC 73 is prescribed by the clamp voltage Cvdd and made stable toward the variations in the temperature and power supply voltage Vcc. The time constant prescribed by the resistor Rtc and the capacitor Ctc does not depend on the variations in the temperature and power supply voltage Vcc either. Also a decision level Vint does not depend on the variations in the temperature and power supply voltage Vcc either. Thus, as shown in FIG. 29, the time Ts necessary for the voltage Ntm to reach from the commencement of discharge of the time constant circuit to the decision level Vint becomes constant. A time interval from the falling edge of the countup pulse Fstr to the output of the coincidence by the detector (falling edge of Cstp) becomes a constant interval. The time Ts is set to, for example, a time interval like 100 ms. Thus, the oscillation frequency of the oscillator 23 can be dynamically adjusted for each cycle of the pulse Fstr with the constant interval Ts of the pulse as the reference in such a way as to coincide with a target frequency and not to be affected by the variations in the temperature and power supply voltage Vcc.

Applying the built-in oscillator circuit module descried above to a semiconductor integrated circuit brings about the following advantageous effects. Since the user-optional built-in clock signal can be generated, there is no need to externally provide parts such as a crystal oscillator, a capacitor, etc., and the design of a board becomes easy.

A frequency stable toward variations in manufacturing process, a change in temperature and a variation in power supply can be obtained by internal oscillations.

Since a frequency sampling terminal can be multiplexed onto other terminals, the number of external terminals can be reduced by two as compared with the case in which the crystal oscillator is used.

Since the oscillation frequency of the semiconductor integrated circuit can be set by a customer, allowance can be made to the period provided for design of an application system by the customer. Further, flexibility is enhanced even with respect to the design of the application system.

There is no need to produce and build in the frequency at the design stage of a microcomputer, and general-purpose microcomputer design can be carried out. It is, therefore, possible to reduce its design cost or the like.

Since there is not provided a terminal for an oscillator, EMS and EMI characteristics can be enhanced. Since no oscillator is used, a reduction in power consumption is enabled.

While the invention made above by the present inventors has been described specifically on the basis of the embodiments, the present invention is not limited to them. It is needless to say that various changes can be made thereto within the scope not departing from the gist thereof.

For instance, the non-volatile memory may be an electric fuse. The PLSG 72 shown in FIG. 26 may be constituted of an external circuit of a semiconductor integrated circuit. The semiconductor integrated circuit is not limited to the microcomputer. The semiconductor integrated circuit can be widely applied to a semiconductor integrated circuit which needs a clock signal for the purpose of a synchronous operation as typified by a system on-chip type LSI or the like having a CPU. The built-in oscillator circuit module may generate a plurality of internal clock signals VCLK which have different frequency, and may generate a plurality of internal clock signals CLK which have different frequency. The reference voltage generator may be a bandgap type reference voltage generator using bipolar transistors. The built-in circuit module of the data processing LSI typified by the microcomputer is not limited to FIG. 1 and may suitably be changed.

An advantageous effect obtained by a representative one of the inventions disclosed in the present application will be described in brief as follows:

A semiconductor integrated circuit is capable of performing built-in oscillations with high accuracy.

What is claimed is:

1. A semiconductor integrated circuit, comprising:
   a memory circuit;
   an oscillator circuit which generates an internal clock signal, based on control information stored in the memory circuit; and
   a logic circuit which generates control information for causing the frequency of the internal clock signal to coincide with the frequency of an external clock signal generated outside,
   wherein the internal clock signal is used for a synchronous operation of an internal circuit.

2. A semiconductor integrated circuit according to claim 1, wherein the logic circuit generates control information in response to instructions for a predetermined operation mode.

3. A semiconductor integrated circuit according to claim 2, wherein the logic circuit performs the operation of generating control information in synchronism with a clock signal generated based on control information initially given to the memory circuit.

4. A semiconductor integrated circuit according to claim 2, wherein the logic circuit performs the operation of generating control information in synchronism with the external clock signal.

5. A semiconductor integrated circuit according to claim 2, wherein the logic circuit performs the operation of generating control information in synchronism with a clock signal generated by another oscillator circuit oscillated in response to instructions for a predetermined operation mode.

6. A semiconductor integrated circuit according to claim 1, further comprising a non-volatile memory device which stores the control information generated by the logic circuit,
   wherein the control information stored in the non-volatile memory device is loaded into the memory circuit in response to power-on reset.

7. A semiconductor integrated circuit according to claim 1, further comprising a sampling circuit which samples information that respond to the respective frequencies of the internal clock signal and the external clock signal,
   wherein the logic circuit compares the frequencies of the internal clock signal and the external clock signal using the information sampled by the sampling circuit and thereby generates control information which causes an internal clock signal frequency to coincide with an external clock signal frequency.

8. A semiconductor integrated circuit according to claim 1, further comprising a comparator which performs a difference comparison between the frequency of the internal clock signal and the frequency of the external clock signal,
   wherein the logic circuit generates control information which allows the internal clock signal frequency to coincide with the external clock signal frequency, using the result of comparison by the comparator.

9. A semiconductor integrated circuit according to claim 7, wherein the logic circuit is a central processing unit and the memory circuit is a register accessible by the central processing unit.

10. A semiconductor integrated circuit according to claim 1, wherein the memory circuit is a counter, and
wherein the logic circuit performs a difference comparison between the frequency of the internal clock signal and the frequency of the external clock signal and upcounts or downcounts the counter using the result of comparison.

11. A semiconductor integrated circuit according to claim 1, wherein the logic circuit inputs the result of comparison made between the frequency of the internal clock signal and the frequency of the external clock signal from outside and generates control information which causes the internal clock signal frequency to coincide with the external clock signal frequency by reference to the input result of comparison.

12. A semiconductor integrated circuit according to claim 1, further comprising:
a digital/analog converter which analog-converts control data stored in the memory circuit with respect to a conversion reference voltage; and
a bias circuit which forms a bias voltage corresponding to an operating power supply voltage determined based on a voltage outputted from the digital/analog converter,
wherein the oscillator circuit is a voltage-controlled oscillator which uses the voltage determined based on the output voltage of the digital/analog converter as an operating power supply voltage and whose oscillation frequency is controlled by the bias voltage, and
wherein the bias circuit includes a constant current circuit which is provided with MOS transistors each of which meets a gate-to-source voltage condition under which a change in drain-to-source current is small with respect to a change in temperature, and which outputs drain voltages of the MOS transistors as control voltages.

13. A semiconductor integrated circuit according to claim 12,
wherein the constant current circuit includes a p channel type first MOS transistor of which the source receives a power supply voltage and whose gate and drain are short-circuited therebetween, an n channel type second MOS transistor of which the source receives a circuit's ground voltage and whose gate and drain are short-circuited therebetween, and a resistive element having one end connected to the drain of the first MOS transistor and the other end connected to the drain of the second MOS transistor, and
wherein the constant current circuit outputs a drain voltage of the first MOS transistor and a drain voltage of the second MOS transistor as control voltages respectively.

14. A semiconductor integrated circuit according to claim 13, wherein the output voltage of the digital/analog converter is supplied as an operating power supply voltage for the voltage-controlled oscillator and the bias circuit via a voltage follower amplifier.

15. A semiconductor integrated circuit according to claim 12, further comprising a reference voltage generator which generates a reference voltage that has compensated for a voltage variation with respect to variations in power supply voltage and temperature,
wherein the digital/analog converter inputs the reference voltage as a conversion reference voltage.

16. A semiconductor integrated circuit according to claim 1, further comprising:
a digital/analog converter which analog-converts control data held in the memory circuit with respect to the conversion reference voltage; and
a bias circuit which forms a bias voltage, based on a voltage outputted from the digital/analog converter,
wherein the oscillator circuit is a voltage-controlled oscillator which includes a CMOS circuit type ring oscillator section and whose oscillation frequency is controlled by the bias voltage for current control with respect to the ring oscillator section, and
wherein the bias circuit applies an operating power supply voltage in the direction to suppress a variation in logical threshold voltage of a CMOS circuit to the oscillator circuit to thereby compensate for variations in the oscillation frequency of the ring oscillator section due to a change in temperature.

17. A semiconductor integrated circuit according to claim 16,
wherein the voltage-controlled oscillator has CMOS inverter delay stages corresponding to odd-numbered stages, which constitute the ring oscillator section, and
wherein the bias circuit has a logical threshold voltage simulation circuit section which simulates a logical threshold voltage of said each CMOS inverter stage, and varies the operating power supply voltage of the oscillator circuit using the output of the logical threshold voltage simulation circuit.

18. A semiconductor integrated circuit according to claim 16, further comprising a reference voltage generator which generates a reference voltage that has compensated for a voltage variation with respect to variations in power supply voltage and temperature,
wherein the digital/analog converter inputs the reference voltage as a conversion reference voltage.

19. A semiconductor integrated circuit according to claim 1, further comprising a variable divider which divides the clock signal outputted from the oscillator circuit.

20. A semiconductor integrated circuit, comprising:
a memory circuit;
an oscillator circuit which generates an internal clock signal, based on control information held in the memory circuit; and
a logic circuit which counts the internal clock signal for each constant interval of a periodically generated pulse and updates the control information in the direction to allow the count value to coincide with an expected value,
wherein the internal clock signal is used for a synchronous operation of an internal circuit.

21. A semiconductor integrated circuit according to claim 20, further comprising an interval generator which periodically generates a constant interval of a pulse,
wherein the interval generator includes a pulse generator, a CR time constant circuit which performs either a charge operation or a discharge operation from a predetermined phase point of a pulse generated from the pulse generator, and a detector which detects that the voltage obtained by the CR time constant circuit reaches a stipulated voltage, and
wherein a time interval from the predetermined phase point to the timing of detection by the detector is defined as the constant interval.

22. A semiconductor integrated circuit according to claim 21, wherein the stipulated voltage is formed based on a reference voltage generated from a reference voltage generator, and the reference voltage is a voltage that has compensated for a voltage variation with respect to variations in power supply voltage and temperature.

23. A semiconductor integrated circuit according to claim 21, wherein the memory circuit is an updown counter.

24. A semiconductor integrated circuit according to claim 23, wherein the updown counter performs upcount or downcount in synchronism with a pulse generated from the pulse generator.

25. A semiconductor integrated circuit according to claim 20, further comprising:
   a digital/analog converter which analog-converts control data held in the memory circuit with respect to a conversion reference voltage; and
   a bias circuit which forms a bias voltage varied according to a voltage outputted from the digital/analog converter,
   wherein the oscillator circuit is a voltage-controlled oscillator whose oscillation frequency is controlled by the bias voltage.

26. A semiconductor integrated circuit according to claim 25, further comprising a reference voltage generator which generates a reference voltage that has compensated for a voltage variation with respect to variations in power supply voltage and temperature,
   wherein the digital/analog converter inputs the reference voltage as a conversion reference voltage.

27. A semiconductor integrated circuit according to claim 20, further including a non-volatile memory device,
   wherein the non-volatile memory device holds control information initially loaded into the memory circuit in response to power-on reset and the expected value loaded into the logic circuit.

28. A semiconductor integrated circuit according to claim 27, wherein the non-volatile memory device is capable of electrically reprogramming memory information.

29. A semiconductor integrated circuit, comprising:
   a memory circuit;
   an oscillator circuit which generates an internal clock signal, based on control information held in the memory circuit; and
   a controller which allows the frequency of the internal clock signal to coincide in the outside,
   wherein the internal clock signal is used for a synchronous operation of an internal circuit.

* * * * *